(12) United States Patent
Li et al.

(10) Patent No.: US 12,398,065 B2
(45) Date of Patent: Aug. 26, 2025

(54) GLASS CERAMICS, CHEMICALLY STRENGTHENED GLASS, AND SEMICONDUCTOR SUBSTRATE

(71) Applicant: AGC Inc., Tokyo (JP)

(72) Inventors: Qing Li, Tokyo (JP); Yusuke Arai, Tokyo (JP); Akio Koike, Tokyo (JP); Kazutaka Ono, Tokyo (JP); Hitomi Furuta, Tokyo (JP); Shigeki Sawamura, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/644,271

(22) Filed: Apr. 24, 2024

(65) Prior Publication Data

US 2024/0270626 A1 Aug. 15, 2024

Related U.S. Application Data

(63) Continuation of application No. 17/443,202, filed on Jul. 22, 2021, which is a continuation of application No. PCT/JP2019/033487, filed on Aug. 27, 2019.

(30) Foreign Application Priority Data

Feb. 8, 2019 (JP) .................. 2019-021896

(51) Int. Cl.
C03C 10/00 (2006.01)
C03C 4/18 (2006.01)
(Continued)

(52) U.S. Cl.
CPC ............ *C03C 10/0027* (2013.01); *C03C 4/18* (2013.01); *C03C 21/002* (2013.01); *H01L 23/15* (2013.01); *C03C 2204/00* (2013.01)

(58) Field of Classification Search
None
See application file for complete search history.

(56) References Cited

U.S. PATENT DOCUMENTS

| 6,472,338 B1 | 10/2002 | Shimatani et al. |
| 7,000,430 B1 | 2/2006 | Fotheringham et al. |

(Continued)

FOREIGN PATENT DOCUMENTS

| CN | 1344233 A | 4/2002 |
| CN | 104870393 A | 8/2015 |

(Continued)

OTHER PUBLICATIONS

Foreign priority document JP2018-105958 claimed by US 20210214269 (Year: 2018).*

(Continued)

*Primary Examiner* — David Sample
(74) *Attorney, Agent, or Firm* — Oblon, McClelland, Maier & Neustadt, L.L.P.

(57) ABSTRACT

A glass sheet, containing, in mass % on an oxide basis: 45-70% of $SiO_2$, 1-15% of $Al_2O_3$, 10-25% of $Li_2O$, 0-10% of $Na_2O$, 0-5% of $K_2O$, and 0-15% of $ZrO_2$. $K_2O/R_2O$ is 0.10 or less and $ZrO_2/R_2O$ is 0.30 or more, where $R_2O$ is a total content of $Li_2O$, $Na_2O$, and $K_2O$. The glass sheet has an average thermal expansion coefficient at 50° C.-350° C. of $90\times10^{-7}/°$ C.-$140\times10^{-7}/°$ C. and a Young's modulus of 85 GPa or more.

20 Claims, 7 Drawing Sheets

(51) Int. Cl.
*C03C 21/00* (2006.01)
*H01L 23/15* (2006.01)

(56) References Cited

U.S. PATENT DOCUMENTS

| | | | |
|---|---|---|---|
| 7,017,370 | B1 | 3/2006 | Fotheringham et al. |
| 11,718,556 | B2 | 8/2023 | Li et al. |
| 2005/0090377 | A1 | 4/2005 | Shelestak et al. |
| 2005/0143246 | A1 | 6/2005 | Comte et al. |
| 2009/0263662 | A1 | 10/2009 | Shelestak et al. |
| 2010/0233407 | A1 | 9/2010 | Shelestak et al. |
| 2011/0079048 | A1 | 4/2011 | Shelestak et al. |
| 2012/0196109 | A1 | 8/2012 | Marjanovic et al. |
| 2013/0189486 | A1 | 7/2013 | Wang et al. |
| 2013/0224492 | A1 | 8/2013 | Bookbinder et al. |
| 2014/0134397 | A1 | 5/2014 | Amin et al. |
| 2015/0064474 | A1 | 3/2015 | Dejneka et al. |
| 2015/0274581 | A1 | 10/2015 | Beall et al. |
| 2015/0299036 | A1 | 10/2015 | Ukrainczyk et al. |
| 2015/0368140 | A1 | 12/2015 | Ikemoto et al. |
| 2016/0023944 | A1 | 1/2016 | Bookbinder et al. |
| 2016/0102010 | A1 | 4/2016 | Beall et al. |
| 2016/0152512 | A9 | 6/2016 | Beall et al. |
| 2017/0144921 | A1 | 5/2017 | Beall et al. |
| 2017/0158556 | A1 | 6/2017 | Dejneka et al. |
| 2017/0297956 | A1 | 10/2017 | Bookbinder et al. |
| 2017/0334767 | A1 | 11/2017 | Beall et al. |
| 2018/0022640 | A1 | 1/2018 | Dejneka et al. |
| 2018/0186685 | A1 | 7/2018 | Murayama et al. |
| 2018/0186686 | A1 | 7/2018 | Beall et al. |
| 2018/0265397 | A1 | 9/2018 | Murayama et al. |
| 2018/0319706 | A1 | 11/2018 | Murayama et al. |
| 2018/0327304 | A1 | 11/2018 | Murayama et al. |
| 2019/0071348 | A1 | 3/2019 | Beall et al. |
| 2019/0194057 | A1 | 6/2019 | Murayama et al. |
| 2019/0263713 | A1 | 8/2019 | Murayama et al. |
| 2019/0292099 | A1 | 9/2019 | Murayama et al. |
| 2020/0002221 | A1 | 1/2020 | Beall et al. |
| 2020/0017398 | A1 | 1/2020 | Click et al. |
| 2020/0017399 | A1 | 1/2020 | Click et al. |
| 2020/0123046 | A1 | 4/2020 | Dejneka et al. |
| 2020/0131080 | A1 | 4/2020 | Yuan |
| 2020/0156994 | A1 | 5/2020 | Li et al. |
| 2020/0180992 | A1 | 6/2020 | Rai et al. |
| 2020/0207660 | A1 | 7/2020 | Li et al. |
| 2020/0231491 | A1 | 7/2020 | Beall et al. |
| 2020/0239354 | A1 | 7/2020 | Li et al. |
| 2020/0346969 | A1* | 11/2020 | Li ............... C03B 23/0357 |
| 2021/0002164 | A1 | 1/2021 | Beall et al. |
| 2021/0024405 | A1 | 1/2021 | Yu et al. |
| 2021/0053867 | A1 | 2/2021 | Murayama et al. |
| 2021/0101824 | A1 | 4/2021 | Beall et al. |
| 2021/0101825 | A1 | 4/2021 | Beall et al. |
| 2021/0114919 | A1 | 4/2021 | Beall et al. |
| 2021/0114920 | A1 | 4/2021 | Beall et al. |
| 2021/0206684 | A1 | 7/2021 | Nozaki et al. |
| 2021/0214269 | A1* | 7/2021 | Yuki ............... C03C 10/0009 |
| 2022/0048810 | A1 | 2/2022 | Yu et al. |
| 2022/0274869 | A1 | 9/2022 | Murayama et al. |

FOREIGN PATENT DOCUMENTS

| | | | |
|---|---|---|---|
| CN | 105143125 A | 12/2015 | |
| CN | 106103369 A | 11/2016 | |
| CN | 107902909 A | 4/2018 | |
| CN | 108473369 A | 8/2018 | |
| CN | 108473370 A | 8/2018 | |
| CN | 109133670 A | 1/2019 | |
| JP | 3-23237 A | 1/1991 | |
| JP | 2001-48582 A | 2/2001 | |
| JP | 2005-53711 A | 3/2005 | |
| JP | 2007-527354 A | 9/2007 | |
| JP | 2010-116315 A | 5/2010 | |
| JP | 2013-520385 A | 6/2013 | |
| JP | 2013-541485 A | 11/2013 | |
| JP | 2016-160136 A | 9/2016 | |
| JP | 2016-529197 A | 9/2016 | |
| JP | 2016-529201 A | 9/2016 | |
| JP | 2017-190265 A | 10/2017 | |
| JP | 2017-530933 A | 10/2017 | |
| WO | WO-2011103798 A1 * | 9/2011 | ........... C03C 21/002 |
| WO | WO 2014/167894 A1 | 10/2014 | |
| WO | WO 2016/154235 A1 | 9/2016 | |
| WO | WO 2017/179401 A1 | 10/2017 | |
| WO | WO 2019/022033 A1 | 1/2019 | |
| WO | WO 2019/022035 A1 | 1/2019 | |

OTHER PUBLICATIONS

Translation of foreign priority document JP2019-021896 (Year: 2019).*
International Search Report issued Nov. 12, 2019 in PCT/JP2019/033487 filed on Aug. 27, 2019, 1 page.
International Search Report issued May 21, 2019 in PCT/JP2019/006907 filed on Feb. 22, 2019, 1 page.
Zhichao Zhou, et al., "Microstructure Analysis of Inorganic Materials," Zhejiang University Press, vol. 1, Dec. 31, 1993, 11 pages (with English language translation).
Office Action mailed Apr. 10, 2024, in related U.S. Appl. No. 17/525,554.
"Methods of Making Three Dimensional Glass Ceramic Articles", U.S. Appl. No. 62/755,787 (Year: 2018), 38 pages.

* cited by examiner

GLASS CERAMICS, CHEMICALLY STRENGTHENED GLASS, AND SEMICONDUCTOR SUBSTRATE

CROSS REFERENCE TO RELATED APPLICATIONS

This application is a continuation of U.S. application Ser. No. 17/443,202, filed on Jul. 22, 2021, which is a continuation of PCT/JP2019/033487, filed on Aug. 27, 2019, and claims priority to Japanese Patent Application No. 2019-021896, filed on Feb. 8, 2019. The entire contents of each are incorporated herein by reference.

TECHNICAL FIELD

The present invention relates to glass ceramics, chemically strengthened glass, and a semiconductor-supporting substrate.

BACKGROUND ART

Chemically strengthened glasses are used as the cover glasses of portable digital assistances, etc.

A chemically strengthened glass is obtained, for example, by bringing a glass into contact with a molten salt which contains alkali metal ions and causing ion exchange between alkali metal ions contained in the glass and alkali metal ions contained in the molten salt to form a compressive stress layer in the glass surface.

Glass ceramics are obtained by precipitating crystals in a glass, and is harder and less apt to receive scratches as compared with amorphous glasses containing no crystals. Patent Literature 1 presents an example in which glass ceramics were chemically strengthened by ion exchange treatment. However, glass ceramics are inferior to amorphous glasses in transparency.

Patent Literature 2 describes transparent glass ceramics. However, there are few transparent glass ceramics having high transparency which renders the glass ceramics suitable for use as cover glasses. The chemical strengthening properties of glass ceramics are greatly affected by the glass composition and the precipitated crystals. The scratch resistance and transparency of the glass ceramics are also greatly affected by the glass composition and the precipitated crystals. It is hence necessary to delicately regulate a glass composition and precipitated crystals, for obtaining glass ceramics excellent in terms of both chemical strengthening property and transparency.

Meanwhile, in the field of semiconductor packaging, techniques such as wafer-level packaging (WLP) or panel-level packaging (PLP) are receiving attention (see Patent Literature 2). These techniques are, for example, a technique in which silicon chips are placed on a glass substrate and encapsulated by molding an encapsulating resin.

In this technique, there are cases where the supporting substrate is removed during the production. Widely used as the supporting substrate are glass substrates. Since the glass substrates are transparent, they can be made removable by irradiation with laser light. The glass substrates for use as supporting substrates are required to be less apt to be damaged in the packaging step, not to scatter fragments upon breakage, and to match in thermal expansion with the semiconductors.

CITATION LIST

Patent Literature

Patent Literature 1: JP-T-2016-529201 (The term "JP-T" as used herein means a published Japanese translation of a PCT patent application.)
Patent Literature 2: JP-A-2016-160136

SUMMARY OF INVENTION

Technical Problem

The present invention provides a glass ceramic excellent in terms of transparency and chemical strengthening property. The present invention further provides a chemically strengthened glass which has a high thermal expansion coefficient, is excellent in terms of transparency and strength, and is less apt to scatter fragments upon breakage.

Solution to Problem

The present invention provides a glass ceramic having a visible-light transmittance of 85% or more in terms of a thickness of 0.7 mm, and a haze value of 1.0% or less in terms of a thickness of 0.7 mm, and
  including, in mass % on an oxide basis:
  45-70% of $SiO_2$;
  1-15% of $Al_2O_3$; and
  10-25% of $Li_2O$.

The present invention further provides a chemically strengthened glass having a compressive stress layer in a surface thereof, the chemically strengthened glass being a glass ceramic that has a visible-light transmittance of 85% or more in terms of a thickness of 0.7 mm, and a haze value of 0.5% or less in terms of a thickness of 0.7 mm,
  has a surface compressive stress value of 500 MPa or more and a depth of the compressive stress layer of 80 µm or more, and
  includes, in mass % on an oxide basis:
  45-70% of $SiO_2$;
  1-15% of $Al_2O_3$; and
  10-25% of $Li_2O$.

The present invention further provides a semiconductor-supporting substrate including the glass ceramic or the chemically strengthened glass.

Advantageous Effects of Invention

According to the present invention, a glass ceramic excellent in terms of transparency and chemical strengthening property is obtained. Furthermore, a chemically strengthened glass which has a high thermal expansion coefficient, is excellent in terms of transparency and strength, and is less apt to scatter fragments upon breakage is obtained.

BRIEF DESCRIPTION OF DRAWINGS

FIG. 5A is a cross-sectional view showing the supporting glass which has not been laminated; and FIG. 5B is a cross-sectional view showing the supporting glass which has been laminated.

DESCRIPTION OF EMBODIMENTS

In this description, "-" indicating a numerical range is used in the sense of including the numerical values set forth before and after the "-" as a lower limit value and an upper limit value unless otherwise indicated.

In this description, "amorphous glass" and "glass ceramic" are collectively referred to as "glass". In this description, the term "amorphous glass" means a glass in which no diffraction peak indicating crystals is observed by a powder X-ray diffraction method. A "glass ceramic" is a glass obtained by heating an "amorphous glass" to precipitate crystals therein, and contains the crystals.

In an examination by powder X-ray diffractometry, a sample is examined using CuKα ray in the 2θ range of 10°-80°; in cases when diffraction peaks have appeared, the precipitated crystals are identified by, for example, a Hanawalt method.

Hereinafter, the term "chemically strengthened glass" means a glass having undergone a chemical strengthening treatment, and the term "glass for chemical strengthening" means a glass before being subjected to a chemical strengthening treatment.

The "base composition of a chemically strengthened glass" is the glass composition of the glass for chemical strengthening. Except for the case where an immoderate ion exchange treatment has been performed, the glass composition of any portion of the chemically strengthened glass which lies deeper than a depth of compressive stress layer DOL is the base composition of the chemically strengthened glass.

In this description, glass composition is expressed in mass % on an oxide basis unless otherwise indicated, and "mass %" is simply written as "%".

In this description, the expression "substantially contain no" means that the content is not higher than a level of impurities contained in raw materials or the like, i.e., the substance has not been intentionally added. Specifically, the content is, for example, less than 0.1%.

Figure 1:
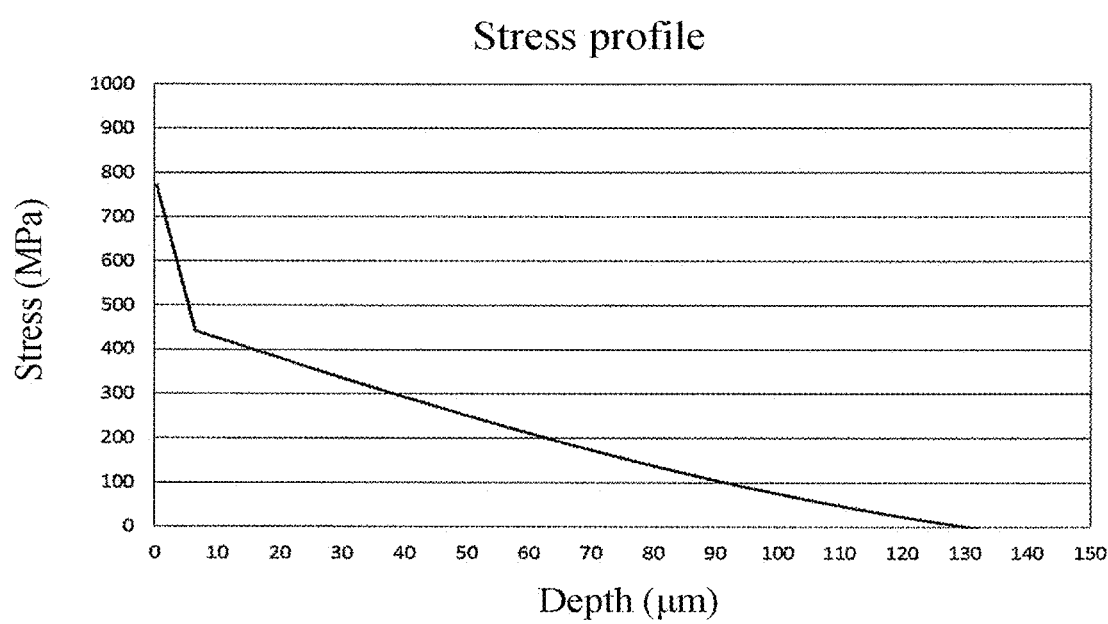
FIG. 1 is a diagram illustrating one example of stress profiles of a chemically strengthened glass.

In this description, the term "stress profile" means a profile showing compressive stress values using the depth from a glass surface as a variable. An example is shown in FIG. 1. In the stress profile, tensile stress is expressed as negative compressive stress.

"Compressive stress value (CS)" can be determined by forming a thin section of the glass and analyzing the thin-section sample by a birefringence imaging system. The birefringence imaging system birefringence stress meter is a device for measuring the magnitude of any retardation caused by stress by using a polarization microscope, a liquid-crystal compensator, etc. An example thereof is birefringence imaging system Abrio-IM, manufactured by CRi, Inc.

There are cases where CS values can be determined by utilizing scattered-light photoelasticity. In this method, light is caused to enter the glass through a surface thereof and the resultant scattered light is analyzed for polarization, thereby determining the CS. Examples of stress meters in which scattered-light photoelasticity is utilized include scattered-light photoelastic stress meters SLP-1000 and SLP-2000, manufactured by Orihara Manufacturing Co., Ltd.

In this description, "depth of compressive stress layer (DOL)" is a depth at which the compressive stress value becomes zero. Hereinafter, surface compressive stress value is sometimes denoted by $CS_0$ and compressive stress value at a depth of 50 μm is sometimes denoted by $CS_{50}$. The term "internal tensile stress (CT)" means a tensile stress value at a depth corresponding to ½ of a sheet thickness t.

In this description, the term "light transmittance" means an average light transmittance of light having wavelengths ranging from 380 nm to 780 nm. The term "haze value" is measured using a C illuminant in accordance with JIS K3761:2000.

In this description, the color of glass ceramic is a color determined from a transmission spectrum of a 0.7-mm-thick sample of the glass ceramic sheet under C illuminant. The color is expressed using either tristimulus values X, Y, and Z according to the XYZ color system defined by JIS Z8701:1999 and the appendix thereof or a main wavelength λd and an excitation purity Pe which are calculated from those values.

In this description, the term "Vickers hardness" means the Vickers hardness (HV0.1) defined in JIS R1610:2003.

"Fracture toughness value" can be measured using a DCDC method (*Acta metall. mater.*, Vol. 43, pp. 3453-3458, 1995).

In this description, the term "semiconductor" means not only a semiconductor wafer of silicon, etc., or a semiconductor chip, but also sometimes a composite structure including a chip, a wiring layer, and a mold resin.

<Glass Ceramic>

From the standpoint of enabling a remarkable improvement in strength by chemical strengthening, a thickness (t) of the present glass ceramic is preferably 3 mm or less, and is more preferably 2 mm or less, 1.6 mm or less, 1.1 mm or less, 0.9 mm or less, 0.8 mm or less, and 0.7 mm or less stepwise. From the standpoint of obtaining sufficient strength through a chemical strengthening treatment, the thickness (t) is preferably 0.3 mm or more, more preferably 0.4 mm or more, still more preferably 0.5 mm or more.

Since the present glass ceramic has a light transmittance of 85% or more when having a thickness of 0.7 mm, use of the present glass ceramic as the cover glasses of portable displays renders images on the display screens easy to see. The light transmittance is preferably 88% or more, more preferably 90% or more. The higher the light transmittance, the more preferred. Usually, however, the light transmittance is 91% or less. The transmittance of 90% is comparable to that of ordinary amorphous glasses.

The haze value, in the case where the thickness is 0.7 mm, is 1.0% or less, and is preferably 0.4% or less, more preferably 0.3% or less, still more preferably 0.2% or less, especially preferably 0.15% or less. The smaller the haze value, the more preferred. However, if the degree of crystallinity or the crystal-particle size is reduced in order to reduce a haze value, this results in a decrease in mechanical strength. From the standpoint of attaining high mechanical strength, the haze value in the case of a thickness of 0.7 mm is preferably 0.02% or more, more preferably 0.03% or more.

The present glass ceramic has a Y value according to the XYZ color system of preferably 87 or more, more preferably 88 or more, still more preferably 89 or more, especially preferably 90 or more. For use as cover glasses for portable displays, it is preferable that the coloration of the glass itself is as little as possible, from the standpoint of heightening the displayed-color reproducibility in the case of using the glass ceramic on the display screen side or from the standpoint of maintaining design attractiveness in the case of using the glass ceramic on the housing side. The present glass ceramic hence has an excitation purity Pe of preferably 1.0 or less, more preferably 0.75 or less, still more preferably 0.5 or less, especially preferably 0.35 or less, most preferably 0.25 or less.

In the case where the present glass ceramic or a strengthened glass obtained by strengthening the glass ceramic is for use as a cover glass of a portable display, it is preferable that this glass gives a texture and a sense of high quality different from plastics. From this standpoint, the present glass ceramic has a main wavelength λd of preferably 580 nm or less and a refractive index of preferably 1.52 or more, more preferably 1.55 or more, still more preferably 1.57 or more.

Figure 2:
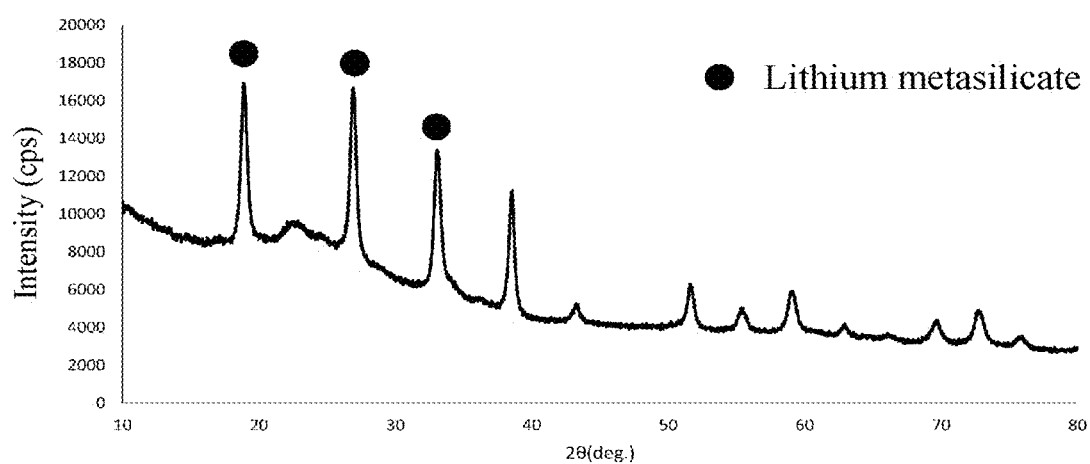
FIG. 2 is a diagram illustrating one example of powder X-ray diffraction patterns of a glass ceramic.

The present glass ceramic is preferably a glass ceramic containing lithium metasilicate crystals. Lithium metasilicate crystals are expressed by $Li_2SiO_3$ and are crystals generally giving a powder X-ray diffraction spectrum having diffraction peaks at Bragg angles (2θ) of about 26.98°, 18.88°, and 33.05°. FIG. 2 shows an example of X-ray diffraction spectra of the present glass ceramic, in which lithium metasilicate crystals are observed.

Figure 3:
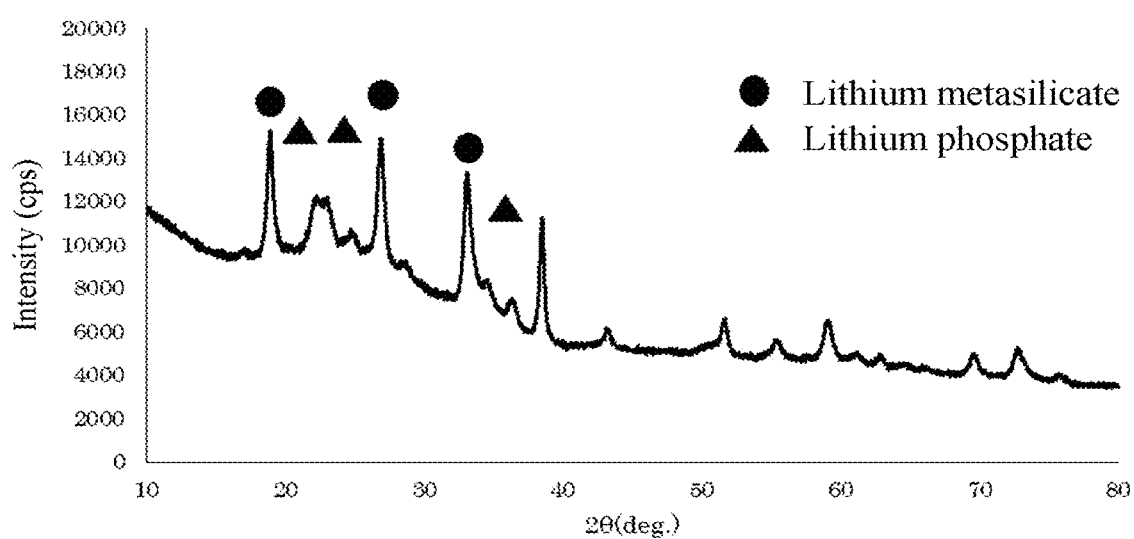
FIG. 3 is a diagram illustrating one example of powder X-ray diffraction patterns of another glass ceramic.

It is also preferable that the present glass ceramic is a glass ceramic containing lithiumphosphate crystals. Lithiumphosphate crystals are expressed by $Li_3PO_4$ and are crystals giving a powder X-ray diffraction spectrum having diffraction peaks at Bragg angles (2θ) of about 22.33°, 23.18°, and 33.93°. FIG. 3 shows an example of powder X-ray diffraction spectra of the present glass ceramic, in which lithium metasilicate crystals and lithiumphosphate crystals are clearly observed. A comparison between FIG. 2 and FIG. 3 indicates that the glass ceramic of FIG. 2 also contains lithiumphosphate crystals. The precipitation of lithiumphosphate crystals tends to enhance the chemical durability.

The present glass ceramic may contain both lithium metasilicate crystals and lithiumphosphate crystals.

The present glass ceramic is obtained by heating and crystallizing an amorphous glass which will be described later.

The glass ceramic containing lithium metasilicate crystals has a higher fracture toughness value than usual amorphous glasses and is less apt to suffer an intense fracture even when high compressive stress is provided by chemical strengthening. There are cases where, in an amorphous glass in which lithium metasilicate crystals can be precipitated, the precipitation of lithium disilicate occurs depending on heat-treatment conditions, etc. Lithium disilicate is expressed by $Li_2Si_2O_5$ and is crystals generally giving a powder X-ray diffraction spectrum having diffraction peaks at Bragg angles (2θ) of about 24.89°, 23.85°, and 24.40°.

In the case where the glass ceramic contains lithium disilicate crystals, it is preferable that the lithium disilicate crystals have a particle size (referred to also as crystal size) of 45 nm or less, the particle size being determined using a Scherrer equation from the widths of X-ray diffraction peaks. This is because transparency is apt to be obtained with such lithium disilicate crystals. The particle size thereof is more preferably 40 nm or less.

However, in cases when lithium metasilicate crystals and lithium disilicate crystals are simultaneously contained in a glass ceramic, this glass ceramic is prone to have reduced transparency. It is hence preferable that the present glass ceramic does not contain lithium disilicate. The expression "does not contain lithium disilicate" means that the glass ceramic gives an X-ray diffraction spectrum in which no diffraction peak of lithium disilicate crystals is detected.

The present glass ceramic has a degree of crystallinity of preferably 5% or more, more preferably 10% or more, still more preferably 15% or more, especially preferably 20% or more, from the standpoint of heightening the mechanical strength. From the standpoint of heightening the transparency, the degree of crystallinity thereof is preferably 70% or less, more preferably 60% or less, especially preferably 50% or less. The glass ceramic having a low degree of crystallinity is superior in that this glass is easy to be subjected to bending formation, etc. by heating. The term "degree of crystallinity" as used herein, for example, a degree of crystallinity of a glass ceramic in which lithium metasilicate crystals and lithiumphosphate crystals have been precipitated means a degree of crystallinity for both the lithium metasilicate crystals and the lithiumphosphate crystals.

The degree of crystallinity can be calculated from X-ray diffraction intensity by a Rietveld method. The Rietveld method is described in "Handbook of Crystal Analysis" edited by the "Handbook of Crystal Analysis" Editing Committee of the Crystallographic Society of Japan (published by Kyoritsu Shuppan Co., Ltd., 1999, pp. 492-499).

The average particle size of the precipitated crystals in the present glass ceramic is preferably 80 nm or less, more preferably 60 nm or less, still more preferably 50 nm or less, especially preferably 40 nm or less, most preferably 30 nm or less. The average particle size of precipitated crystals is determined from images obtained with a transmission electron microscope (TEM). The average particle size of precipitated crystals can be estimated from images obtained with a scanning electron microscope (SEM).

The present glass ceramic has an average thermal expansion coefficient at 50-350° C. of preferably $90 \times 10^{-7}$/° C. or more, more preferably $100 \times 10^{-7}$/° C. or more, still more preferably $110 \times 10^{-7}$/° C. or more, especially preferably $120 \times 10^{-7}$/° C. or more, most preferably $130 \times 10^{-7}$/° C. or more.

In case where the thermal expansion coefficient is too high, there is a possibility that this glass might crack due to a difference in thermal expansion during chemical strengthening. The average thermal expansion coefficient is hence preferably $160 \times 10^{-7}$/° C. or less, more preferably $150 \times 10^{-7}$/° C. or less, still more preferably $140 \times 10^{-7}$/° C. or less.

The glass ceramic having such a thermal expansion coefficient is suitable for use as a supporting substrate for semiconductor packages including resin components in large proportions.

The present glass ceramic has a high hardness since it contains crystals. Because of this, the glass ceramic is less apt to receive scratches and has excellent wear resistance. The Vickers hardness thereof is preferably 600 or more, more preferably 700 or more, still more preferably 730 or more, especially preferably 750 or more, most preferably 780 or more, from the standpoint of enhancing the wear resistance.

Too high hardness result in poor workability. The Vickers hardness of the present glass ceramic is hence preferably 1,100 or less, more preferably 1,050 or less, still more preferably 1,000 or less.

The present glass ceramic has a Young's modulus of preferably 85 GPa or more, more preferably 90 GPa or more, still more preferably 95 GPa or more, especially preferably 100 GPa or more, from the standpoint of inhibiting strengthening warpage during chemical strengthening. There are cases where the present glass ceramic is polished before being used. From the standpoint of facilitating polishing, the Young's modulus thereof is preferably 130 GPa or less, more preferably 125 GPa or less, still more preferably 120 GPa or less.

The present glass ceramic has a fracture toughness value of 0.8 MPa·m$^{1/2}$ or more, more preferably 0.85 MPa·m$^{1/2}$ or more, still more preferably 0.9 MPa·m$^{1/2}$ or more. This is because the glass ceramic having such a fracture toughness value, after having been chemically strengthened, is less apt to scatter fragments upon breakage.

The present glass ceramic preferably has a relative permittivity ε of 8.0 or less at a frequency of 10 GHz. This is because the glass ceramic having such a relative permittivity brings about satisfactory communication efficiency when used in radio communication appliances for high-frequency communication. The relative permittivity ε of the present glass ceramic at a frequency of 10 GHz is more preferably 7.6 or less, still more preferably 7.3 or less. The ε thereof is usually 3.7 or more.

The present glass ceramic has a lower dielectric loss tangent tan δ at a frequency of 10 GHz than the glass which has not undergone crystallization; the present glass ceramic is hence preferred. The reduced dielectric loss tangent is owing to the fact that crystals having a lower tan δ than the glass have precipitated in the glass and this precipitation has reduced the tan δ of the glass as a whole. The tan δ thereof is preferably 0.014 or less because the present glass ceramic having such a value of tan δ brings about satisfactory communication efficiency when used in radio communication appliances for high-frequency communication. The dielectric loss tangent tan δ of the present glass ceramic at a frequency of 10 GHz is more preferably 0.012 or less, still more preferably 0.010 or less, yet still more preferably 0.008 or less. The tan δ thereof is usually 0.002 or more.

The present glass ceramic has the same glass composition as the amorphous glass which has not undergone crystallization yet, and thus the glass composition thereof will be explained later in the section "Amorphous Glass".

<Chemically Strengthened Glass>

The chemically strengthened glass (hereinafter sometimes referred to as "the present strengthened glass") obtained by chemically strengthening the present glass ceramic preferably has a surface compressive stress value $CS_0$ of 600 MPa or more. This is because the present strengthened glass having such a surface compressive stress value is less apt to crack when deformed by deflection, etc. The surface compressive stress value of the present strengthened glass is more preferably 800 MPa or more.

The present strengthened glass has a depth of compressive stress layer DOL of preferably 80 µm or more. This is because the strengthened glass is less apt to crack even when a surface thereof receives scratches. The DOL thereof is preferably 100 µm or more.

The larger the compressive stress value $CS_{50}$ at a depth of compressive stress layer of 50 µm, the higher the strength in the drop-onto-sandpaper test shown below, i.e., drop strength. The $CS_{50}$ thereof is preferably 80 MPa or more, more preferably 100 MPa or more, still more preferably 120 MPa or more, especially preferably 140 MPa or more.

(Drop-onto-Sandpaper Test)

A glass sheet (120 mm×60 mm×0.7 mm) to be evaluated is taken as a cover glass for a smartphone and attached to a housing as an imitation of the smartphone, and this assembly is dropped onto the surface of flat SiC #180 sandpaper. The total mass of the glass sheet and the housing is adjusted to about 140 g.

The test is initiated with a height of 30 cm, and in cases when the chemically strengthened glass sheet has not cracked, this assembly is then dropped from a height increased by 10 cm. The dropping is thus repeated and the height [unit: cm] which has resulted in cracking is recorded. This test as one set is repeated to conduct 10 sets, and an average of the heights which have resulted in cracking is taken as "drop height".

The present strengthened glass preferably has a drop height in the drop-onto-sandpaper test of 80 cm or more.

It is preferable that the present strengthened glass has an internal tensile stress (CT) of 110 MPa or less, because this chemically strengthened glass having such a CT is inhibited from scattering fragments upon breakage. The CT thereof is more preferably 100 MPa or less, still more preferably 90 MPa or less. Meanwhile, a reduction in CT tends to reduce the surface compressive stress, making it difficult to obtain sufficient strength. Consequently, the CT thereof is preferably 50 MPa or more, more preferably 55 MPa or more, still more preferably 60 MPa or more.

The present strengthened glass has a four-point bending strength of preferably 500 MPa or more, more preferably 550 MPa or more, still more preferably 600 MPa or more. The four-point bending strength is measured using a test piece of 40 mm×5 mm×0.8 mm under the conditions of a lower span of 30 mm, an upper span of 10 mm, and a cross head speed of 0.5 mm/min. An average value for 10 test pieces is taken as the four-point bending strength.

A higher Vickers hardness of the present strengthened glass tends to become higher than the unstrengthened glass, through the chemical strengthening treatment. This is thought to be because the ion exchange between small ions in crystals and large ions in the molten salt has produced compressive stress in the crystals.

The Vickers hardness of the present strengthened glass is preferably 720 or more, more preferably 740 or more, still more preferably 780 or more. The Vickers hardness of the present strengthened glass is usually 950 or less.

In general, the glass transition points of glass ceramics are higher than the glass transition points of amorphous glasses having the same glass composition. From the standpoint of inhibiting stress relaxation from occurring during chemical strengthening treatments, the glass transition point of the glass ceramic is preferably 500° C. or more, more preferably 530° C. or more, still more preferably 550° C. or more, especially preferably 570° C. or more. From the standpoint of subjecting the glass ceramic to, for example, bending with heating, the glass transition point of the glass ceramic is preferably 850° C. or less, more preferably 800° C. or less, still more preferably 750° C. or less, especially preferably 700° C. or less.

The difference ΔTg between the glass transition point of the present glass ceramic and the glass transition point of an amorphous glass having the same glass composition is preferably 200° C. or less, more preferably 195° C. or less, still more preferably 190° C. or less. Glass ceramics having a small ΔTg are easy to process by, for example, bending with heating.

The present strengthened glass has the same visible-light transmittance, haze value, and high-frequency characteristics as the present glass ceramic. Explanations thereon are hence omitted.

The present strengthened glass as a whole has approximately the same composition as the glass ceramic which has not been strengthened, except for the case where the strengthened glass has undergone an immoderate ion exchange treatment. In particular, the portion lying most deeply from the glass surfaces has the same composition as the glass ceramic which has not been strengthened, except for the case where the strengthened glass has undergone an immoderate ion exchange treatment.

<Amorphous Glass>

The amorphous glass according to the present invention preferably includes, in mass % on an oxide basis, 45-70% of $SiO_2$, 1-15% of $Al_2O_3$, 10-25% of $Li_2O$, 0-12% of $P_2O_5$, 0-15% of $ZrO_2$, 0-10% of $Na_2O$, 0-5% of $K_2O$, and 0-6% of $Y_2O_3$.

This glass composition is explained below.

In the present amorphous glass, $SiO_2$ is a component forming a network structure of the glass. In addition, $SiO_2$ is a component enhancing the chemical durability and is a constituent component of lithium metasilicate as precipitated crystals. The content of $SiO_2$ is preferably 45% or more. The content of $SiO_2$ is more preferably 48% or more, still more preferably 50% or more, especially preferably 52% or more, extremely preferably 54% or more. Meanwhile, from the standpoint of enhancing meltability, the content of $SiO_2$ is preferably 70% or less, more preferably 68% or less, still more preferably 66% or less, especially preferably 64% or less.

$Al_2O_3$ is a component increasing the surface compressive stress to be generated by chemical strengthening, and is essential. The content of $Al_2O_3$ is preferably 1% or more. The content of $Al_2O_3$ is more preferably 2% or more, still more preferably 4% or more, especially preferably 6% or more, extremely preferably 8% or more. Meanwhile, from the standpoint of preventing the glass from having too high a devitrification temperature, the content of $Al_2O_3$ is preferably 15% or less, more preferably 12% or less, still more preferably 10% or less, especially preferably 8% or less, most preferably 6% or less.

$Li_2O$ is a component forming surface compressive stress through ion exchange, is a constituent component of lithium metasilicate crystals, and is essential. The content of $Li_2O$ is preferably 10% or more, more preferably 14% or more, still more preferably 16% or more, especially preferably 18% or more. Meanwhile, from the standpoint of stabilizing the glass, the content of $Li_2O$ is preferably 25% or less, more preferably 22% or less, still more preferably 20% or less.

$Na_2O$ is a component improving the meltability of the glass. Although $Na_2O$ is not essential, the content thereof is preferably 0.5% or more, more preferably 1% or more, especially preferably 2% or more. In case where the content of $Na_2O$ is too high, lithium metasilicate crystals are less apt to be precipitated or the glass has a reduced chemical strengthening property. The content of $Na_2O$ hence is preferably 10% or less, more preferably 9% or less, still more preferably 8% or less, especially preferably 7% or less.

$K_2O$ is a component lowering the melting temperature of the glass like $Na_2O$, and may be contained. In cases when $K_2O$ is contained, the content thereof is preferably 0.5% or more, more preferably 1% or more, still more preferably 1.5% or more, especially preferably 2% or more. Too high $K_2O$ contents result in a decrease in chemical strengthening property or a decrease in chemical durability. The content of $K_2O$ hence is preferably 5% or less, more preferably 4% or less, still more preferably 3% or less, especially preferably 2% or less.

The total content of $Na_2O$ and $K_2O$, i.e., $Na_2O+K_2O$, is preferably 1% or more, more preferably 2% or more.

In cases when the sum of $Li_2O$, $Na_2O$, and $K_2O$, i.e., $Li_2O+Na_2O+K_2O$, is expressed by $R_2O$, it is preferable that $K_2O/R_2O$ is 0.2 or less. This is because such value of the ratio can enhance the chemical strengthening properties and heighten the chemical durability. That ratio is more preferably 0.15 or less, still more preferably 0.10 or less.

$R_2O$ is 10% or more, preferably 15% or more, more preferably 20% or more. Meanwhile, $R_2O$ is 29% or less, preferably 26% or less.

$P_2O_5$, although not essential, has the effect of promoting phase separation in the glass to accelerate crystallization and may be contained. In cases when $P_2O_5$ is contained, the content thereof is preferably 0.5% or more, more preferably 2% or more, still more preferably 4% or more, especially preferably 5% or more, extremely preferably 6% or more. Meanwhile, too high $P_2O_5$ contents not only make the glass prone to undergo phase separation during melting but also result in a considerable decrease in acid resistance. The content of $P_2O_5$ is preferably 12% or less, more preferably 10% or less, still more preferably 8% or less, especially preferably 7% or less.

$ZrO_2$ is a component capable of constituting crystal nuclei in a crystallization treatment and may be contained. The content of $ZrO_2$ is preferably 1% or more, more preferably 2% or more, still more preferably 4% or more, especially preferably 6% or more, most preferably 7% or more. Meanwhile, from the standpoint of inhibiting devitrification during melting, the content of $ZrO_2$ is preferably 15% or less, more preferably 14% or less, still more preferably 12% or less, especially preferably 11% or less.

In cases when the sum of $Li_2O$, $Na_2O$, and $K_2O$, i.e., $Li_2O+Na_2O+K_2O$, is expressed by $R_2O$, then $ZrO_2/R_2O$ is preferably 0.10 or more, more preferably 0.30 or more, from the standpoint of enhancing the chemical durability. From the standpoint of heightening the transparency after crystallization, $ZrO_2/R_2O$ is preferably 0.80 or less, more preferably 0.60 or less.

$TiO_2$ is a component capable of constituting crystal nuclei in a crystallization treatment and may be contained. Although $TiO_2$ is not essential, the content thereof, in cases when $TiO_2$ is contained, is preferably 0.5% or more, more preferably 1% or more, still more preferably 2% or more, especially preferably 3% or more, most preferably 4% or more. Meanwhile, from the standpoint of inhibiting devitrification during melting, the content of $TiO_2$ is preferably 10% or less, more preferably 8% or less, still more preferably 6% or less.

$SnO_2$ serves to accelerate the formation of crystal nuclei and may be contained. Although $SnO_2$ is not essential, the content thereof, in cases when $SnO_2$ is contained, is preferably 0.5% or more, more preferably 1% or more, still more preferably 1.5% or more, especially preferably 2% or more. Meanwhile, from the standpoint of inhibiting devitrification during melting, the content of $SnO_2$ is preferably 6% or less, more preferably 5% or less, still more preferably 4% or less, especially preferably 3% or less.

$Y_2O_3$ is a component which renders the chemically strengthened glass less apt to scatter fragments upon breakage, and may be contained. The content of $Y_2O_3$ is preferably 1% or more, more preferably 1.5% or more, still more preferably 2% or more, especially preferably 2.5% or more, extremely preferably 3% or more. Meanwhile, from the standpoint of inhibiting devitrification during melting, the content of $Y_2O_3$ is preferably 5% or less, more preferably 4% or less.

$B_2O_3$, although not essential, is a component which improves the chipping resistance of the glass for chemical strengthening or the chemically strengthened glass and improves the meltability, and may be contained. The content of $B_2O_3$, in cases when it is contained, is preferably 0.5% or more, more preferably 1% or more, still more preferably 2% or more, from the standpoint of improving the meltability. Meanwhile, in case where the content of $B_2O_3$ exceeds 5%, striae during melting or phase separation tends to occur to lower the quality of the glass for chemical strengthening. The content thereof is hence preferably 5% or less. The content of $B_2O_3$ is more preferably 4% or less, still more preferably 3% or less, especially preferably 2% or less.

BaO, SrO, MgO, CaO, and ZnO are components improving the meltability of the glass and may be contained. In cases when these components are contained, the sum of BaO, SrO, MgO, CaO, and ZnO, i.e., BaO+SrO+MgO+CaO+ZnO, is preferably 0.5% or more, more preferably 1% or more, still more preferably 1.5% or more, especially preferably 2% or more. Meanwhile, the content of BaO+SrO+MgO+CaO+ZnO is preferably 8% or less, more preferably 6% or less, still more preferably 5% or less, especially preferably 4% or less, as ion exchange rate decreases.

Of those components, BaO, SrO, and ZnO may be contained in order to heighten the refractive index of the residual glass to a value close to that of a precipitated-crystal phase and thereby improve a light transmittance of a glass ceramic and reduce a haze value. In this case, the total content of BaO+SrO+ZnO is preferably 0.3% or more, more preferably 0.5% or more, still more preferably 0.7% or more, especially preferably 1% or more. Meanwhile, there are cases where these components reduce the ion exchange rate. From the standpoint of imparting satisfactory chemical strengthening properties, BaO+SrO+ZnO is preferably 2.5% or less, more preferably 2% or less, still more preferably 1.7% or less, especially preferably 1.5% or less.

$La_2O_3$, $Nb_2O_5$, and $Ta_2O_5$ are all components which render the chemically strengthened glass less apt to scatter fragments upon breakage, and may be contained in order to heighten the refractive index.

The total content of $La_2O_3$, $Nb_2O_5$, and $Ta_2O_5$, i.e., $La_2O_3+Nb_2O_5+Ta_2O_5$, is preferably 0.5% or more, more preferably 1% or more, still more preferably 1.5% or more, especially preferably 2% or more. From the standpoint of rendering the glass less apt to devitrify during melting, $La_2O_3+Nb_2O_5+Ta_2O_5$ is preferably 4% or less, more preferably 3% or less, still more preferably 2% or less, especially preferably 1% or less.

$CeO_2$ may be contained. $CeO_2$ has the effect of oxidizing the glass and sometimes inhibits coloration. The content of $CeO_2$, in cases when it is contained, is preferably 0.03% or more, more preferably 0.05% or more, still more preferably 0.07% or more. In the case of using $CeO_2$ as an oxidizing agent, the content of $CeO_2$ is preferably 1.5% or less, more preferably 1.0% or less, from the standpoint of heightening the transparency.

In the case where the strengthened glass is to be used as a colored glass, a coloring component may be added so long as the addition thereof does not inhibit the attainment of the desired chemical strengthening properties. Suitable examples of the coloring components include $Co_3O_4$, $MnO_2$, $Fe_2O_3$, NiO, CuO, $Cr_2O_3$, $V_2O_5$, $Bi_2O_3$, $SeO_2$, $Er_2O_3$, and $Nd_2O_3$.

The content of such coloring components is preferably 1% or less in total. In the case where the glass is desired to have a higher visible-light transmittance, it is preferable that those components are not substantially contained.

$SO_3$, a chloride, a fluoride, etc. may be suitably contained as a refining agent for use in glass melting. It is preferable that $As_2O_3$ is not contained. In cases when $Sb_2O_3$ is contained, the content thereof is preferably 0.3% or less, more preferably 0.1% or less. It is most preferable that no $Sb_2O_3$ is contained.

The present amorphous glass has a glass transition point Tg of preferably 390° C. or more, more preferably 410° C. or more, still more preferably 420° C. or more. In cases when the glass transition point Tg thereof is high, stress relaxation is less apt to occur during chemical strengthening and, hence, high strength is apt to be obtained. Meanwhile, too high a Tg renders glass forming, etc. difficult. Consequently, the Tg thereof is preferably 650° C. or less, more preferably 600° C. or less.

The present amorphous glass has a thermal expansion coefficient of preferably $90 \times 10^{-7}$/° C. or more, more preferably $100 \times 10^{-7}$/° C. or more, still more preferably $110 \times 10^{-7}$/° C. or more. Meanwhile, too high thermal expansion coefficients make the glass prone to crack during forming. Consequently, the thermal expansion coefficient thereof is preferably $150 \times 10^{-7}$/° C. or less, more preferably $140 \times 10^{-7}$/° C. or less. In case where there is a large difference in thermal expansion coefficient between the amorphous glass and lithium metasilicate crystals, cracking due to the difference in thermal expansion coefficient is prone to occur during crystallization.

In cases when the present amorphous glass is pulverized and examined with a differential scanning calorimeter, the glass gives a DSC curve in which the difference (Tc–Tg) between a glass transition point ($Tg_{DSC}$) determined from the DSC curve and the temperature (Tc) corresponding to a crystallization peak appearing in the lowest-temperature range in the DSC curve is preferably 80° C. or more, more preferably 85° C. or more, still more preferably 90° C. or more, especially preferably 95° C. or more. In cases when (Tc–Tg) is large, it is easy to process the glass ceramic by bending with reheating, etc. (Tc–Tg) is preferably 150° C. or less, more preferably 140° C. or less.

Figure 4:
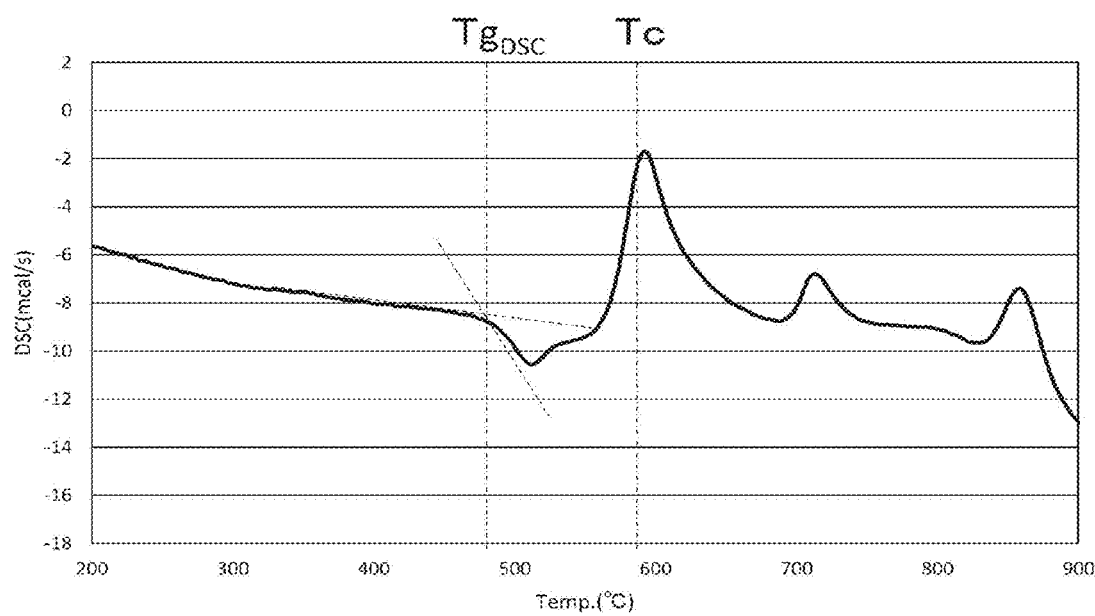
FIG. 4 is a diagram illustrating one example of DSC curves of an amorphous glass according to the present invention.

FIG. 4 shows one example of DSC curves of an amorphous glass according to the present invention. There are cases where the $Tg_{DSC}$ shown in FIG. 4 does not coincide with a glass transition point (Tg) determined from a thermal expansion curve. In addition, since the glass is examined after having been pulverized, a large measurement error is prone to occur. However, for evaluating a relationship with crystallization peak temperature, it is appropriate to use the $Tg_{DSC}$ determined by the same DSC examination rather than the Tg determined from a thermal expansion curve.

The present amorphous glass has a Young's modulus of preferably 75 GPa or more, more preferably 80 GPa or more, still more preferably 85 GPa or more.

The Vickers hardness thereof is preferably 500 or more, more preferably 550 or more.

<Production Method of Chemically Strengthened Glass>

The chemically strengthened glass of the present invention is produced by heat-treating the amorphous glass to obtain a glass ceramic and then subjecting the obtained glass ceramic to a chemical strengthening treatment.

(Production of Amorphous Glass)

The amorphous glass can be produced, for example, by the following method. Note that the following production method is an example of producing a sheet-shaped chemically strengthened glass.

Glass raw materials are mixed so as to obtain a glass having a preferred composition, and the mixture is heated and melted in a glass melting furnace. Thereafter, the molten glass is homogenized by bubbling, stirring, addition of a refining agent, etc., subsequently formed into a glass sheet with a given thickness by a known forming method, and annealed. Alternatively, use may be made of a method in which the molten glass is formed into a block and the block is annealed and then cut into a sheet form.

Examples of methods for forming a sheet-shaped glass include a float process, a press process, a fusion process, and a downdraw process. Particularly in the case of producing a large-sized glass sheet, a float process is preferred. In addition, continuous forming methods other than the float process, such as a fusion process and a downdraw process are also preferred.

(Crystallization Treatment)

A glass ceramic is obtained by heat-treating the amorphous glass obtained by the procedure above.

The heat treatment is preferably a two-step heat treatment in which the amorphous glass is heated from room temperature to a first treatment temperature, held at this temperature for a certain time period, and then held for a certain time period at a second treatment temperature which is higher than the first treatment temperature.

In the case of performing the two-step heat treatment, the first treatment temperature is preferably in a temperature range where the glass composition has a high crystal nucleation rate and the second treatment temperature is preferably in a temperature range where the glass composition has a high crystal growth rate. It is preferable that the period of holding at the first treatment temperature is long enough to produce a sufficient number of crystal nuclei. The production of a large number of crystal nuclei results in crystals having small size to yield a glass ceramic having high transparency.

The first treatment temperature is, for example, 450-700° C. and the second treatment temperature is, for example, 600-800° C. The glass is held at the first treatment temperature for 1 to 6 hours and then held at the second treatment temperature for 1 to 6 hours.

The glass ceramic obtained by the procedure above is ground and polished as necessary to form a glass ceramic sheet. In the case where the glass ceramic sheet is to be cut into a given shape and size or to be chamfered, it is preferred to perform the cutting or chamfering before giving a chemical strengthening treatment to the glass ceramic sheet, as a compressive stress layer is formed also in the edge faces by the later chemical strengthening treatment.

(Chemical Strengthening Treatment)

The chemical strengthening treatment is a treatment in which a glass is brought into contact with a metal salt by, for example, a method of immersing the glass in a melt of the metal salt (e.g., potassium nitrate) containing metal ions having a large ionic radius (typically, Na ions or K ions), thereby replacing metal ions having a small ionic radius (typically, Na ions or Li ions) contained in the glass with metal ions having a large ionic radius (typically, Na ions or K ions for replacing Li ions; K ions for replacing Na ions).

From the standpoint of heightening the rate of chemical strengthening treatment, it is preferred to use "Li—Na exchange" in which Li ions in the glass are replaced with Na ions. From the standpoint of forming higher compressive stress by ion exchange, it is preferred to use "Na—K exchange" in which Na ions in the glass are replaced with K ions.

Examples of the molten salt for performing the chemical strengthening treatment include nitrates, sulfates, carbonates, and chlorides. Among these, examples of the nitrates include lithium nitrate, sodium nitrate, potassium nitrate, cesium nitrate, and silver nitrate. Examples of the sulfates include lithium sulfate, sodium sulfate, potassium sulfate, cesium sulfate, and silver sulfate. Examples of the carbonates include lithium carbonate, sodium carbonate, and potassium carbonate. Examples of the chlorides include lithium chloride, sodium chloride, potassium chloride, cesium chloride, and silver chloride. One of these molten salts may be used alone, or two or more thereof may be used in combination.

As for the treatment conditions for the chemical strengthening treatment, time, temperature or the like may be appropriately selected while taking account of the glass composition, the kind of molten salt, etc.

The present strengthened glass is preferably obtained, for example, by the following two-step chemical strengthening treatment.

First, the present glass ceramic is immersed for about 0.1-10 hours in an Na-ion-containing metal salt (e.g., sodium nitrate) having a temperature of about 350-500° C. This causes ion exchange between Li ions contained in the glass ceramic and Na ions contained in the metal salt, and thus a compressive stress layer having a surface compressive stress value of, for example, 200 MPa or more and a maximum depth of compressive stress layer of, for example, 80 μm or more can be formed.

Next, the glass is immersed for about 0.1-10 hours in a K-ion-containing metal salt (e.g., potassium nitrate) having a temperature of about 350-500° C. This produces high compressive stress in the compressive stress layer formed in the previous treatment, in a portion, for example, within a depth of about 10 μm. According to such a two-step treatment, a favorable stress profile with a surface compressive stress value of 500 MPa or more is apt to be obtained.

Meanwhile, in a case where the surface compressive stress value exceeds 1,000 MPa, it is difficult to obtain a large DOL while maintaining a low CT. The surface compressive stress value is preferably 900 MPa or less, more preferably 700 MPa or less, still more preferably 600 MPa or less.

A method may be used in which the glass is first immersed in the Na-ion-containing metal salt, subsequently held in the air at 350-500° C. for 1-5 hours, and then immersed in the K-ion-containing metal salt. The holding temperature is preferably 425-475° C., more preferably 440-460° C.

By holding the glass in the air at such a high temperature, the Na ions which have been introduced into the glass from the metal salt by the first treatment are thermally diffused in the glass to form a more favorable stress profile and thereby heighten the drop strength to asphalt.

Use may also be made of a method in which the glass is immersed in the Na-ion-containing metal salt and is then immersed for 0.1-20 hours in a metal salt containing both Na ions and Li ions (e.g., a mixed salt of sodium nitrate and lithium nitrate) having a temperature of 350-500° C., instead of being held in the air.

By immersing the glass in the metal salt containing Na ions and Li ions, ion exchange is caused between Na ions contained in the glass and Li ions contained in the metal salt to form a more favorable stress profile and thereby heighten the drop strength to asphalt.

From the standpoint of enhancing the drop strength to asphalt, the compressive stress value CS50 at a depth of 50 μm is preferably 100 MPa or more, more preferably 140 MPa or more, still more preferably 160 MPa or more.

In the case of performing such a two-step or three-step strengthening treatment, the total treatment time is preferably 10 hours or less, more preferably 5 hours or less, still more preferably 3 hours or less, from the standpoint of production efficiency. Meanwhile, from the standpoint of obtaining a desired stress profile, the total treatment time needs to be 0.5 hours or more and is more preferably 1 hour or more.

The present strengthened glass is useful not only as the semiconductor-supporting substrate which will be described later but also as a cover glass for use in electronic appliances including mobile devices such as cell phones and smartphones. The present strengthened glass is useful also as the cover glasses of electronic appliances not intended to be portable, such as televisions, personal computers, and touch panels, and as wall surfaces of elevators or wall surfaces of houses, buildings, and the like (entire-wall displays). Furthermore, the present strengthened glass is useful as building materials such as window glasses, table tops, interior materials for motor vehicles, airplanes, etc., and cover glasses for these, and as housings having a curved surface shape, etc.

Since the present strengthened glass has satisfactory high-frequency characteristics, it is suitable for use as the cover glasses of appliances for high-frequency communication.

<Semiconductor-Supporting Substrate>

The semiconductor-supporting substrate (hereinafter also referred to as "supporting glass") of the present invention is explained. The semiconductor-supporting substrate of the present invention includes the glass ceramic of the present invention. From the standpoint of attaining higher strength, it is more preferable that the semiconductor-supporting substrate includes the strengthened glass of the present invention.

Since the present glass ceramic or the present strengthened glass has a high thermal expansion coefficient, these are suitable as a supporting substrate for fan-out packaging. In fan-out packaging, packages having various average thermal expansion coefficients are formed depending on proportions of a semiconductor chip and a resin component. However, there are nowadays cases where molding resins are required to have higher flowability to diminish filling failures and, hence, packages having a large resin component proportion and a high average thermal expansion coefficient are frequently used.

Figure 5A:
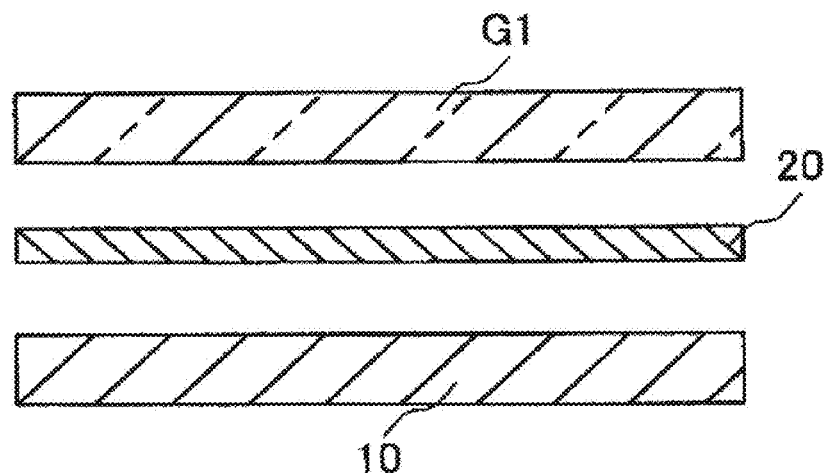
FIG. 5A and FIG. 5B illustrate a supporting glass according to one embodiment of the present invention which is for laminating with a semiconductor substrate.
Figure 5B:
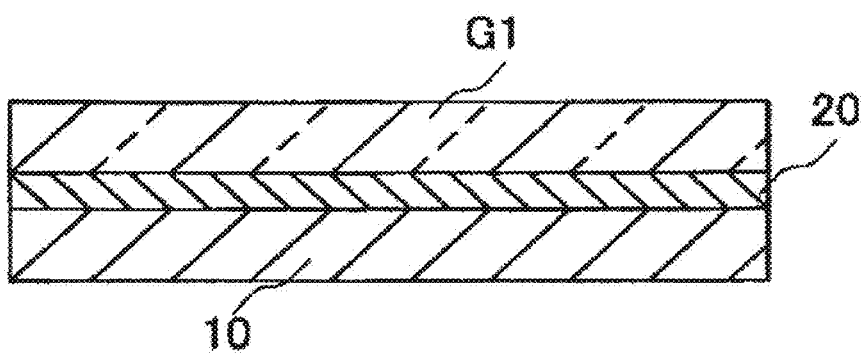

FIG. 5A and FIG. 5B are examples of cross-sectional views of a supporting glass for laminating to semiconductor substrates. The supporting glass G1 shown in FIG. 5A is laminated to a semiconductor substrate 10 at a temperature of, for example, 200-400° C. through a release layer 20 (which may function as a bonding layer), thereby obtaining the laminated substrate 30 shown in FIG. 5B. As the semiconductor substrate 10, use is made, for example, of a full-size semiconductor wafer, a semiconductor chip, a substrate including a semiconductor chip molded with a resin, or a wafer on which elements have been formed. The release layer 20 is, for example, a resin withstanding temperatures of 200-400° C.

The present supporting substrate is used in applications where it is laminated to a semiconductor substrate. For example, the present supporting substrate is used as a supporting glass for fan-out wafer-level packaging, a supporting glass for image sensors, such as MEMSs, CMOSs, and CISs, in which a reduction in element size by wafer-level packaging is effective, a supporting glass having through-holes (glass interposer; GIP), and a support glass for semiconductor back grinding. The present supporting glass is especially suitable as a supporting glass for fan-out wafer-level and panel-level packaging.

Figure 6:
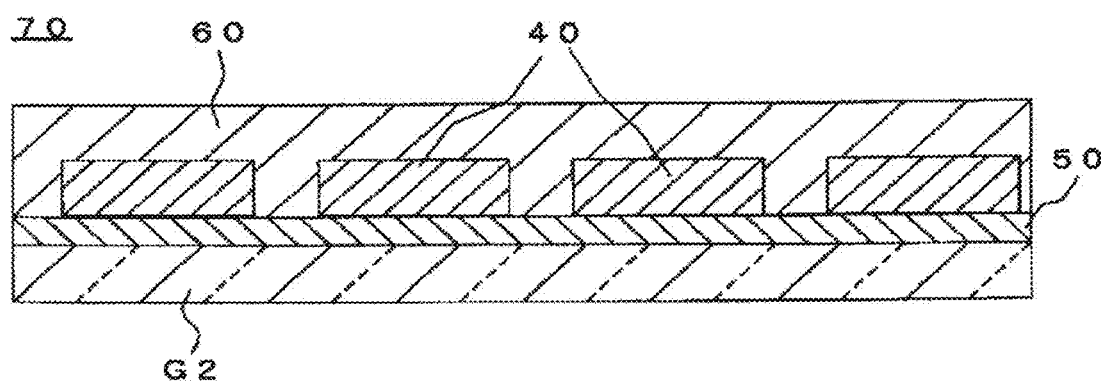
FIG. 6 is a cross-sectional view of a laminated substrate according to one embodiment of the present invention.

FIG. 6 shows one example of cross-sectional views of a laminated substrate in which the present supporting glass is used as a supporting substrate for fan-out wafer-level packaging.

In fan-out wafer-level packaging, semiconductor substrates 40 are laminated to a supporting glass G2 at a temperature of, for example, 200-400° C., through a release layer 50 of resin or the like (which may function as a bonding layer). Furthermore, the semiconductor substrates 40 are embedded with a resin 60, thereby obtaining a laminated substrate 70. Thereafter, the release layer 50 is irradiated with a laser such as ultraviolet light through the supporting glass G2, thereby removing the supporting glass G2 from the semiconductor substrates 40 embedded in the resin 60. The supporting glass G2 is reusable. The semiconductor substrates 40 embedded in the resin 60 are wired with copper wires, etc. Wiring with copper wires or the like may be given beforehand to the surface of the release layer. A substrate including semiconductor chips embedded in a resin 60 may be used as a semiconductor substrate.

The present supporting substrate has a high light transmittance and, hence, a laser of high-energy visible light or a laser of ultraviolet light can be effectively utilized as the laser for use in the removal.

EXAMPLES

The present invention is described below by referring to Examples, but the present invention is not limited thereto.

<Preparation and Evaluation of Amorphous Glasses>

Glass raw materials were mixed so as to result in each of the glass compositions shown in mass % on an oxide basis in Tables 1 and 2, and weighed so as to yield 800 g of a glass. Subsequently, the mixed glass raw materials were put in a platinum crucible and this crucible was introduced into an electric furnace at 1,600° C., in which the mixture was melted, degassed, and homogenized for about 5 hours.

The obtained molten glass was cast into a mold, held for 1 hour at a temperature of the glass transition point, and then cooled to room temperature at a rate of 0.5° C./min to obtain a glass block. Some of the obtained block was used to evaluate the amorphous glass for glass transition point, thermal expansion coefficient, specific gravity, Young's modulus, refractive index, and Vickers hardness. The results thereof are shown in Tables 1 and 2. In the tables, each blank indicates that the property was not evaluated.

G1 to G22 and G26 to G33 are examples of amorphous glasses according to the present invention, and G23 to G25 and G34 are comparative examples. G34 had suffered phase separation during the melting operation and was unable to be evaluated.

(Glass Transition Point, Thermal Expansion Coefficient)

In accordance with JIS R1618:2002, a thermal expansion curve was obtained using a thermal dilatometer (TD5000SA, manufactured by Bruker AXS GmbH) under the conditions of a heating rate of 10° C./min, and a glass transition point Tg [unit: ° C.] and a thermal expansion coefficient were determined from the obtained thermal expansion curve.

(Specific Gravity)

The specific gravity was measured by the Archimedes method.

(Young's Modulus)

The Young's modulus was measured by an ultrasonic method.

(Vickers Hardness)

The Vickers hardness was measured by pressing an indenter under a load of 100 gf for 15 seconds using a Shimadzu micro-Vickers hardness tester (HMV-2, manufactured by Shimadzu Corporation).

(DSC Examination)

A glass was pulverized using an agate mortar, and about 80 mg of the powder was put in a platinum cell and examined for DSC with a differential scanning calorimeter (DSC3300SA, manufactured by Bruker GmbH) while being heated from room temperature to 1,100° C. at a heating rate of 10° C./min. A glass transition point $Tg_{DSC}$, a temperature Tc corresponding to a first crystallization peak, and the difference Tc–Tg between these temperatures were determined. FIG. 4 shows the results of the examination of G13.

(High-Frequency Characteristics)

The obtained glass block was processed into a sheet shape having a thickness of 0.5 mm and examined with a network analyzer for relative permittivity ε and dielectric loss tangent tan δ at 10 GHz by a split-post dielectric resonance method (SPDR method). The results thereof are shown in Table 1. After the crystallization treatment which will be described later, the glass was examined in the same manner; the results of the examination made after the crystallization treatment are shown in Table 3.

TABLE 1

|  | G1 | G2 | G3 | G4 | G5 | G6 | G7 | G8 |
|---|---|---|---|---|---|---|---|---|
| $SiO_2$ | 59.5 | 59.9 | 57.7 | 55.8 | 54.9 | 55.3 | 55.2 | 53.8 |
| $Al_2O_3$ | 2.0 | 2.0 | 2.0 | 2.0 | 2.0 | 2.0 | 5.5 | 7.2 |
| $Li_2O$ | 18.4 | 18.5 | 18.5 | 18.3 | 18.3 | 18.4 | 18.2 | 18.1 |
| $Na_2O$ | 2.0 | 3.4 | 5.6 | 4.0 | 5.6 | 7.3 | 4.4 | 4.4 |
| $K_2O$ | 2.0 | 0.0 | 0.0 | 4.1 | 3.4 | 0.9 | 0.8 | 0.8 |
| MgO | 0.0 | 0.0 | 0.0 | 0.0 | 0.0 | 0.0 | 0.0 | 0.0 |
| CaO | 0.0 | 0.0 | 0.0 | 0.0 | 0.0 | 0.0 | 0.0 | 0.0 |
| $P_2O_5$ | 5.9 | 6.0 | 6.0 | 5.9 | 5.9 | 6.0 | 5.9 | 5.8 |
| $ZrO_2$ | 10.1 | 10.1 | 10.1 | 10.0 | 10.0 | 10.1 | 10.0 | 9.9 |
| $Y_2O_3$ | 0.0 | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 | 0.0 |
| $B_2O_3$ | 0.0 | 0.0 | 0.0 | 0.0 | 0.0 | 0.0 | 0.0 | 0.0 |
| SrO | 0.0 | 0.0 | 0.0 | 0.0 | 0.0 | 0.0 | 0.0 | 0.0 |
| $SnO_2$ | 0.0 | 0.0 | 0.0 | 0.0 | 0.0 | 0.0 | 0.0 | 0.0 |
| Specific gravity | 2.52 | 2.53 | 2.53 | 2.54 | 2.54 | 2.54 | 2.55 | 2.55 |
| Tg (° C.) | 453 | 456 | 443 | 439 | 430 | 428 | 450 | 460 |
| Thermal expansion coefficient (×$10^{-7}$/° C.) | 125 | 127 | 131 | 137 | 141 | 144 | 131 | 127 |
| Tc (° C.) | 589 | 586 | 576 |  |  |  | 563 | 564 |
| $Tg_{DSC}$ (° C.) | 470 | 469 | 452 |  |  |  | 460 | 467 |
| Tc-Tg (° C.) | 119 | 117 | 124 |  |  |  | 103 | 97 |
| Young's modulus (GPa) | 87 | 88 | 89 | 89 | 90 | 89 | 90 | 91 |
| Vickers hardness | 604 | 599 | 559 | 550 | 561 | 551 | 540 | 568 |
| Fracture toughness value | 0.77 |  |  |  |  |  |  |  |
| Relative permittivity | 8.6 |  |  |  |  |  |  |  |
| Dielectric loss tangent | 0.017 |  |  |  |  |  |  |  |

|  | G9 | G10 | G11 | G12 | G13 | G14 | G15 | G16 |
|---|---|---|---|---|---|---|---|---|
| $SiO_2$ | 56.6 | 54.0 | 55.2 | 52.6 | 51.2 | 57.0 | 62.3 | 51.1 |
| $Al_2O_3$ | 5.4 | 5.3 | 7.2 | 7.0 | 8.7 | 2.0 | 2.1 | 5.9 |
| $Li_2O$ | 18.1 | 17.6 | 18.0 | 17.5 | 17.4 | 18.1 | 18.7 | 22.0 |
| $Na_2O$ | 2.0 | 2.0 | 2.0 | 1.9 | 1.9 | 2.0 | 2.1 | 1.5 |
| $K_2O$ | 2.0 | 1.9 | 2.0 | 1.9 | 1.9 | 2.0 | 2.1 | 1.5 |
| MgO | 0.0 | 0.0 | 0.0 | 0.0 | 0.0 | 0.0 | 0.0 | 0.0 |
| CaO | 0.0 | 0.0 | 0.0 | 0.0 | 0.0 | 0.0 | 0.0 | 0.0 |
| $P_2O_5$ | 5.9 | 5.7 | 5.8 | 5.7 | 5.6 | 5.8 | 6.1 | 5.9 |
| $ZrO_2$ | 9.9 | 9.6 | 9.9 | 9.6 | 9.5 | 13.1 | 6.8 | 10.1 |
| $Y_2O_3$ | 0.0 | 3.9 | 0.0 | 3.9 | 3.9 | 0.0 | 0.0 | 2.0 |
| $TiO_2$ | 0.0 | 0.0 | 0.0 | 0.0 | 0.0 | 0.0 | 0.0 | 0.0 |
| $B_2O_3$ | 0.0 | 0.0 | 0.0 | 0.0 | 0.0 | 0.0 | 0.0 | 0.0 |
| SrO | 0.0 | 0.0 | 0.0 | 0.0 | 0.0 | 0.0 | 0.0 | 0.0 |
| $SnO_2$ | 0.0 | 0.0 | 0.0 | 0.0 | 0.0 | 0.0 | 0.0 | 0.0 |
| Specific gravity | 2.53 | 2.59 | 2.54 | 2.59 | 2.60 | 2.57 | 2.47 |  |
| Tg (° C.) | 469 | 470 | 467 | 468 | 471 | 465 | 448 |  |
| Thermal expansion coefficient (×$10^{-7}$/° C.) | 122 | 123 | 122 | 120 | 124 | 122 | 128 |  |
| Tc (° C.) |  |  |  | 593 | 592 | 592 | 571 | 571 |
| $Tg_{DSC}$ (° C.) |  |  |  | 489 | 483 | 482 | 459 | 468 |
| Tc-Tg (° C.) |  |  |  | 104 | 109 | 110 | 112 | 103 |
| Young's modulus (GPa) | 87 | 90 | 91 | 91 | 92 | 91 | 87 |  |
| Vickers hardness | 541 | 537 | 543 | 631 | 621 | 627 | 555 |  |
| Fracture toughness value |  |  |  |  | 0.75 |  |  |  |
| Relative permittivity |  |  |  |  |  |  |  |  |
| Dielectric loss tangent |  |  |  |  |  |  |  |  |

TABLE 2

| | G17 | G18 | G19 | G20 | G21 | G22 | G23 | G24 | G25 | G26 | G27 | G28 | G29 | G30 | G31 | G32 | G33 | G34 |
|---|---|---|---|---|---|---|---|---|---|---|---|---|---|---|---|---|---|---|
| $SiO_2$ | 64.0 | 54.5 | 61.5 | 62.9 | 52.0 | 54.9 | 62.9 | 65.4 | 54.0 | 52.8 | 50.3 | 50.7 | 50.8 | 53.5 | 51.0 | 52.8 | 54.4 | 49.9 |
| $Al_2O_3$ | 5.9 | 2.0 | 2.0 | 2.0 | 1.9 | 2.0 | 22.4 | 22.4 | 18.0 | 8.7 | 8.5 | 12.0 | 12.1 | 8.7 | 8.5 | 8.8 | 8.9 | 2.0 |
| $Li_2O$ | 10.0 | 18.4 | 18.4 | 13.0 | 17.5 | 16.9 | 4.3 | 4.3 | 0.0 | 17.5 | 17.0 | 17.2 | 17.3 | 17.4 | 17.0 | 17.6 | 17.8 | 28.0 |
| $Na_2O$ | 2.0 | 2.0 | 0.1 | 2.0 | 1.9 | 5.0 | 2.0 | 2.0 | 13.0 | 1.9 | 1.9 | 1.9 | 2.6 | 0.5 | 0.5 | 1.9 | 2.0 | 2.0 |
| $K_2O$ | 2.0 | 2.0 | 2.0 | 2.0 | 1.9 | 5.6 | 0.0 | 0.0 | 2.3 | 0.0 | 0.0 | 1.9 | 0.8 | 0.8 | 0.8 | 1.9 | 2.0 | 2.0 |
| MgO | 0.0 | 0.0 | 0.0 | 0.0 | 0.0 | 0.0 | 0.0 | 0.0 | 7.6 | 0.0 | 0.0 | 0.0 | 0.0 | 0.0 | 0.0 | 0.0 | 0.0 | 0.0 |
| CaO | 0.0 | 0.0 | 0.0 | 0.0 | 0.0 | 0.0 | 0.0 | 0.0 | 0.9 | 0.0 | 0.0 | 0.0 | 0.0 | 0.0 | 0.0 | 0.0 | 0.0 | 0.0 |
| $P_2O_5$ | 5.9 | 5.9 | 5.9 | 5.9 | 5.7 | 5.8 | 3.0 | 1.5 | 0.0 | 5.7 | 5.5 | 5.6 | 5.6 | 5.6 | 5.5 | 5.7 | 5.7 | 5.9 |
| $ZrO_2$ | 10.1 | 10.1 | 10.1 | 10.1 | 19.0 | 9.8 | 2.3 | 2.3 | 0.0 | 9.6 | 9.3 | 3.2 | 3.2 | 9.6 | 9.3 | 7.4 | 5.4 | 10.1 |
| $Y_2O_3$ | 0.0 | 5.0 | 0.0 | 2.0 | 0.0 | 0.0 | 0.0 | 0.0 | 0.0 | 3.9 | 7.5 | 7.6 | 7.6 | 3.9 | 7.5 | 3.9 | 3.9 | 0.0 |
| $TiO_2$ | 0.0 | 0.0 | 0.0 | 0.0 | 0.0 | 0.0 | 0.0 | 0.0 | 4.2 | 0.0 | 0.0 | 0.0 | 0.0 | 0.0 | 0.0 | 0.0 | 0.0 | 0.0 |
| $B_2O_3$ | 0.0 | 0.0 | 0.0 | 0.0 | 0.0 | 0.0 | 0.0 | 0.0 | 0.0 | 0.0 | 0.0 | 0.0 | 0.0 | 0.0 | 0.0 | 0.0 | 0.0 | 0.0 |
| SrO | 0.0 | 0.0 | 0.0 | 0.0 | 0.0 | 0.0 | 1.0 | 0.0 | 0.0 | 0.0 | 0.0 | 0.0 | 0.0 | 0.0 | 0.0 | 0.0 | 0.0 | 0.0 |
| $SnO_2$ | 0.0 | 0.0 | 0.0 | 0.0 | 0.0 | 0.0 | 2.1 | 2.1 | 0.1 | 0.0 | 0.0 | 0.0 | 0.0 | 0.0 | 0.0 | 0.0 | 0.0 | 0.0 |
| Specific gravity | 2.50 | 2.61 | 2.51 | | 2.57 | 2.55 | | | | | | | | | | 2.59 | 2.54 | |
| Tg (° C.) | 510 | 459 | 463 | | 471 | 423 | 714 | 739 | | 472.0 | 488.0 | 461.0 | 478 | | | 470 | 450 | |
| Thermal expansion coefficient ($\times 10^{-7}$/° C.) | 91 | 128 | 121 | | 117 | 139 | 50 | 50 | | 117 | 119 | 123 | 121 | | | 123 | 124 | |
| Tc (° C.) | 740 | 627 | 593 | 627 | | | 946 | 925 | 730 | 609 | 663 | 593 | 609 | 614 | 677 | 592 | 574 | |
| $Tg_{DSC}$ (° C.) | 535 | 473 | 481 | 501 | | | 711 | 704 | 650 | 494 | 502 | 481 | 484 | 501 | 510 | 485 | 473 | |
| Tc-Tg (° C.) | 205 | 154 | 112 | 126 | | | 235 | 221 | 80 | 116 | 161 | 112 | 125 | 113 | 167 | 107 | 101 | |
| Young's modulus (GPa) | 85 | 91 | 87 | | 94 | 88 | 83 | 83 | | 94 | 95 | 91 | 92 | 94 | 93 | 93 | 90 | |
| Vickers hardness | | | | | 631 | 555 | 590 | 615 | 708 | 573 | 575 | 567 | 577 | 570 | 566 | 570 | 558 | |
| Fracture toughness value | | | | | | | 0.80 | | 0.71 | | | | | | | | | |

<Crystallization Treatment and Evaluation of Glass Ceramics>

The obtained glass blocks were each processed into 50 mm×50 mm×1.5 mm, and this processed glass was heat-treated under each of the sets of conditions shown in Tables 3 and 4 to obtain a glass ceramic. The section "Crystallization conditions" in each table indicates nucleation treatment conditions in the upper portion and crystal growth treatment conditions in the lower portion. For example, in cases when a set of conditions consists of "550° C.-2 h" in the upper portion and "730° C.-2 h" in the lower portion, this means that the glass was held at 550° C. for 2 hours and then held at 730° C. for 2 hours. GC1 to GC17, GC19, and GC23 to GC35 are Working Examples, and GC18 and GC20 to GC22 are Comparative Examples.

The obtained glass ceramics were each processed and mirror-polished to obtain a glass ceramic sheet having a thickness t of 0.7 mm. Rod-shaped samples for examining thermal expansion coefficient were also prepared. Some of each remaining glass ceramic was pulverized and subjected to analysis of precipitated crystals. The results of the evaluation of the glass ceramics are shown in Tables 3 to 5. The blanks indicate that the glasses were not evaluated.

(Visible-Light Transmittance, Y Value, Main Wavelength λd, Excitation Purity Pe)

Each glass ceramic sheet was examined for transmittance within the wavelength range of 380-780 nm using a configuration including a spectrophotometer (LAMBDA950, manufactured by PerkinElmer, Inc.) equipped with an integrating-sphere unit (150-mm InGaAs Int. Sphere) as a detector. An arithmetic average of measured transmittance values was obtained as an average transmittance [unit: %], which was taken as the visible-light transmittance.

Moreover, tristimulus values X, Y, and Z for object in the XYZ color system were calculated from the measured transmittance values to determine an object color under illuminant C. The main wavelength λd and the excitation purity Pe were determined therefrom.

(Haze Value)

Using a hazemeter (HZ-V3, manufactured by Suga Test Instruments Co., Ltd.), a haze value [unit: %] was measured under an illuminant C.

(X-Ray Diffractometry: Precipitated Crystals and Degree of Crystallinity)

Each glass ceramic was examined by powder X-ray diffractometry under the following conditions to identify the precipitated crystals. Furthermore, the degree of crystallinity was calculated from the obtained diffraction intensities by a Rietveld method.

Measurement apparatus: SmartLab, manufactured by Rigaku Corp.

X ray used: CuKα ray

Measurement range: 2θ=10°-80°

Speed: 10°/min

Step: 0.02°

The detected crystals are shown in the section of kinds of crystals in Tables 3 and 4. In the tables, LS indicates lithium metasilicate, LD indicates lithium disilicate, βSP indicates β-spodumene, LP indicates lithiumphosphate, and spinel indicates spinel. Each degree of crystallinity is the sum of the degrees of crystallinity determined for the respective kinds of crystals shown in Tables 3 to 5 by the Rietveld method.

(Crystal Size)

Figure 7:
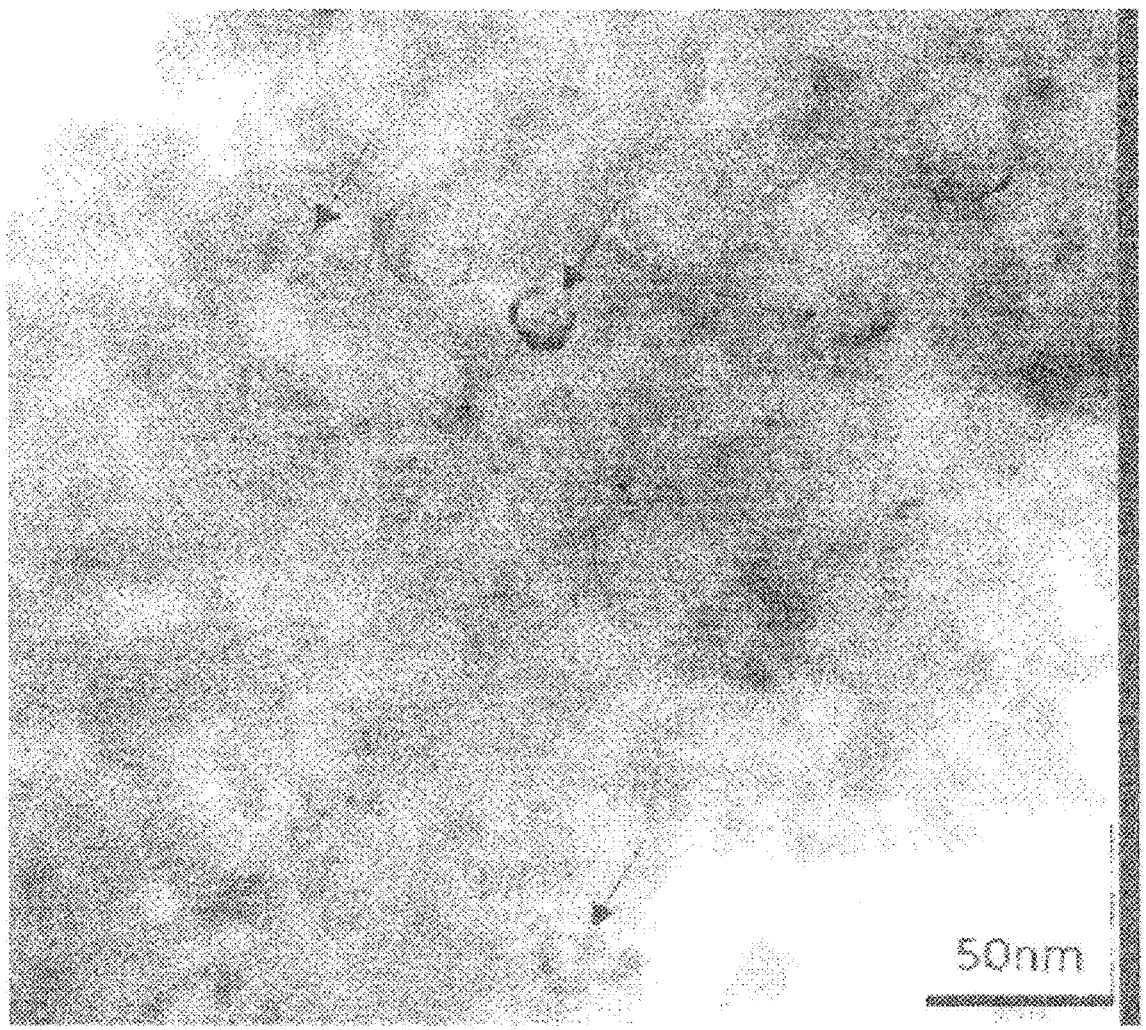
FIG. 7 is a drawing showing one example of TEM images of a glass ceramic.

Glass ceramic GC1 was pulverized with an agate mortar and then sprinkled on a collodion film which had been hydrophilized. An extremely thin portion of the glass was examined with a transmission electron microscope (JEM- 2010F, manufactured by JEOL Ltd.) to determine an average particle diameter (unit: nm) of the precipitated crystals. A TEM image is shown in FIG. 7.

(Glass Transition Point, Thermal Expansion Coefficient, Specific Gravity, Young's Modulus, Vickers Hardness)

The properties were determined in the same manners as for the glasses of before crystallization. Furthermore, the difference in Tg between before and after the crystallization was determined.

(Refractive Index)

Each glass ceramic was mirror-polished to 15 mm×15 mm×0.7 mm and examined for refractive index by a V-block method using precision refractometer KPR-2000 (manufactured by Shimadzu Device Corp.).

TABLE 3

|  | GC1 | GC2 | GC3 | GC4 | GC5 | GC6 | GC7 | GC8 | GC9 | GC10 | GC11 |
|---|---|---|---|---|---|---|---|---|---|---|---|
| Glass composition | G1 | G2 | G3 | G4 | G5 | G6 | G7 | G8 | G9 | G10 | G11 |
| Tg (° C.) before crystallization | 453 | 456 | 443 | 439 | 430 | 428 | 450 | 460 | 469 | 470 | 467 |
| Heat treatment conditions (° C.-hr) | 550-2 730-2 | 550-2 710-2 | 550-2 710-2 | 550-2 710-2 | 550-2 710-2 | 550-2 670-2 | 550-2 730-2 | 550-2 710-2 | 550-2 730-2 | 550-2 710-2 | 550-2 690-2 |
| Light transmittance (%) | 90.1 | 90.6 | 90.5 | 90.1 | 89.8 | 89.5 | 91.1 | 90.3 | 90.7 | 90.5 | 90.6 |
| Y value | 90.3 | 90.8 | 90.7 | 90.3 | 90 | 89.7 | 91.3 | 90.4 | 90.8 | 90.7 | 90.8 |
| Main wavelength $\lambda d$ (nm) | 573 | 573 | 572 | 572 | 573 | 574 | 571 | 574 | 571 | 574 | 572 |
| Excitation purity Pe | 0.31 | 0.44 |  |  |  |  | 0.32 | 0.36 | 0.16 | 0.46 | 0.4 |
| Haze (%) | 0.08 | 0.08 | 0.09 | 0.07 | 0.11 | 0.11 | 0.07 | 0.08 | 0.07 | 0.08 | 0.08 |
| Main crystals | LS LP | LS | LS LP | LP | LS LP | LS | LS LP | LS | LS LP | LS LP | LS LP |
| Crystal size (nm) | 20-40 | 20-40 | 20-40 | 20-40 | 20-40 | 20-40 | 20-40 | 20-40 | 20-40 | 20-40 | 20-40 |
| Degree of crystallinity (%) | 40 or less | 40 or less | 40 or less | 40 or less | 40 or less | 40 or less | 40 or less | 40 or less | 40 or less | 40 or less | 40 or less |
| Specific gravity | 2.59 | 2.59 | 2.61 | 2.62 | 2.63 |  | 2.61 |  | 2.59 | 2.66 | 2.59 |
| Tg (° C.) after crystallization | 627 | 587 | 595 | 585 | 601 | 578 | 624 | 624 | 586 | 585 | 567 |
| ΔTg (° C.) | 174 | 131 | 152 | 146 | 171 | 150 | 174 | 164 | 117 | 115 | 100 |
| Thermal expansion coefficient ($\times 10^{-7}$/° C.) | 134 | 125 | 133 | 139 | 140 | 142 | 126 | 131 | 134 | 125 | 125 |
| Young's modulus (GPa) | 104 | 104 | 106 | 105 | 110 |  | 104 |  | 102 | 104 | 102 |
| Vickers hardness | 801 | 753 | 649 |  | 739 |  |  |  | 668 | 723 | 686 |
| Fracture toughness value | 0.93 |  |  |  |  |  |  |  |  |  |  |
| Refractive index | 1.5757 | 1.5764 | 1.5794 | 1.5799 | 1.5816 | 1.5825 | 1.5784 |  | 1.5759 | 1.5847 | 1.5763 |
| Relative permittivity | 7.23 |  |  |  |  |  |  |  |  |  |  |
| Dielectric loss tangent | 0.007 |  |  |  |  |  |  |  |  |  |  |

TABLE 4

|  | GC12 | GC13 | GC14 | GC15 | GC16 | GC17 | GC18 | GC19 | GC20 | GC21 | GC22 |
|---|---|---|---|---|---|---|---|---|---|---|---|
| Glass composition | G12 | G13 | G14 | G15 | G1 | G1 | G1 | G22 | G23 | G24 | G25 |
| Tg (° C.) before crystallization | 468 | 471 | 465 | 448 | 453 | 453 | 453 | 423 | 714 | 739 | 650 |
| Heat treatment conditions (° C.-hr) | 550-2 710-2 | 550-2 730-2 | 550-2 750-2 | 550-2 710-2 | 550-2 650-2 | 550-2 750-2 | 550-2 780-2 | 550-2 710-2 | 750-4 900-4 | 750-4 920-4 | 650-2 730-2 |
| Visible-light transmittance (%) | 90.6 | 90.4 | 89.1 | 90.6 | 90.9 | 89.3 |  | 90.4 | 89.9 | 88.0 | 88.2 |

TABLE 4-continued

|  | GC12 | GC13 | GC14 | GC15 | GC16 | GC17 | GC18 | GC19 | GC20 | GC21 | GC22 |
|---|---|---|---|---|---|---|---|---|---|---|---|
| Y value | 90.8 | 90.5 | 89.2 | 90.7 | 91.0 | 89.4 |  |  | 90.0 | 87.9 | 87.8 |
| Main wavelength λd (nm) | 570 | 573 | 574 | 576 | 576 | 573 |  |  | 576 | 578 | 582 |
| Excitation purity Pe | 0.20 | 0.20 | 0.3 | 0.34 | 0.35 | 0.38 |  |  | 0.68 | 1.20 | 1.24 |
| Haze (%) | 0.10 | 0.09 | 0.10 | 0.08 | 0.03 | 0.20 | 11.90 | 0.10 | 0.23 | 0.50 | 0.09 |
| Main crystals | LS | LS LP | LS LP | LS | LS | LS | LS LP | LS LD | LS LP | β SP | β SP | spinel |
| Crystal size (nm) | 20-40 | 20-40 | 20-40 | 20-40 | 20-40 | 20-40 | 30-80 | 20-40 | 120 | 120 | 7 |
| Degree of crystallinity (%) | 40 or less | 40 or less | 40 or less | 40 or less | 40 or less | 40 or less | 40 | 73 or less | 71 |  |  |
| Tg (° C.) after crystallization | 611 | 610 | 601 | 638 | 612 |  |  |  | 872 | 902 |  |
| ΔTg (° C.) | 143 | 139 | 136 | 190 | 159 |  |  |  |  |  |  |
| Thermal expansion coefficient (×10$^{-7}$/° C.) | 122 | 123 | 131 | 128 |  |  |  |  | 12 | 12 |  |
| Specific gravity | 2.66 | 2.66 | 2.64 | 2.54 | 2.58 |  | 2.59 | 2.63 | 2.48 | 2.48 |  |
| Young's modulus (GPa) | 105 | 105 | 109 | 103 | 101 | 105 | 107 | 105 | 87 | 90 | 81 |
| Vickers hardness | 818 | 823 | 696 | 723 | 788 | 786 |  | 730 | 783 | 732 |  |
| Fracture toughness value |  | 0.91 |  |  |  |  |  |  | 0.83 |  | 0.72 |
| Refractive index | 1.5854 | 1.5769 | 1.5859 | 1.5639 |  |  | 1.5768 | 1.5232 | 1.5244 |  |  |
| Relative permittivity |  |  |  |  |  |  |  |  | 6.36 |  |  |
| Dielectric loss tangent |  |  |  |  |  |  |  |  | 0.014 |  |  |

TABLE 5

|  | GC23 | GC24 | GC25 | GC26 | GC27 | GC28 | GC29 |
|---|---|---|---|---|---|---|---|
| Glass composition | G26 | G27 | G28 | G29 | G30 | G31 | G32 |
| Tg (° C.) before crystallization | 472 | 488 | 464 | 467 | 469 | 473 | 470 |
| Heat treatment conditions (° C.-hr) | 550-2 710-2 | 550-2 690-2 | 550-2 730-2 | 550-2 710-2 | 550-2 690-2 | 550-2 710-2 | 550-2 730-2 |
| Visible-light transmittance (%) | 90.1 | 88.8 |  |  |  |  | 90.0 |
| Y value |  |  |  |  |  |  |  |
| Main wavelength λd (nm) |  |  |  |  |  |  |  |
| Excitation purity Pe |  |  |  |  |  |  |  |
| Haze (%) | 0.09 | 0.32 | 0.14 | 0.23 | 0.11 | 0.10 | 0.11 |
| Main crystals | LS LP | LS LP | LS LP | LS LP | LS LP | LS LP | LS LP |
| Crystal size (nm) | 20-40 | 20-40 | 20-40 | 20-40 | 20-40 | 20-40 | 20-40 |
| Degree of crystallinity (%) | 40 or less | 40 or less | 40 or less | 40 or less | 40 or less | 40 or less | 40 or less |
| Tg (° C.) after crystallization | 615 | 616 | 602 | 619 |  |  | 605 |

TABLE 5-continued

| | | | | | | |
|---|---|---|---|---|---|---|
| ΔTg (° C.) | 143 | 128 | 138 | 152 | | 135 |
| Thermal expansion coefficient (×10⁻⁷/° C.) | 120 | 121 | 121 | 124 | | 127 |
| Specific gravity | | 2.71 | | | | 2.64 |
| Young's modulus (GPa) | 103 | 104 | 103 | 105 | 103 | 104 104 |
| Vickers hardness | | | | | | 747 |
| Fracture toughness value | | | | | | |
| Refractive index | 1.5852 | 1.5936 | | | | 1.5784 |

| | GC30 | GC31 | GC32 | GC33 | GC34 | GC35 |
|---|---|---|---|---|---|---|
| Glass composition | G33 | G16 | G17 | G18 | G19 | G20 |
| Tg (° C.) before crystallization | 451 | | 510 | 459 | 463 | |
| Heat treatment conditions (° C.-hr) | 550-2 730-2 | 550-2 710-2 | 550-2 750-2 | 550-2 730-2 | 550-2 710-2 | 550-2 730-2 |
| Visible-light transmittance (%) | 89.9 | | | | | |
| Y value | | | | | | |
| Main wavelength λd (nm) | | | | | | |
| Excitation purity Pe | | | | | | |
| Haze (%) | 0.15 | 0.20 | 0.30 | 0.30 | 0.07 | 0.30 |
| Main crystals | LS LP | LS | LP | LS | LS | LS LP |
| Crystal size (nm) | 20-40 | 20-40 | 20-40 | 20-40 | 20-40 | 20-40 |
| Degree of crystallinity (%) | 40 or less | 40 or less | 40 or less | 40 or less | 40 or less | 40 or less |
| Tg (° C.) after crystallization | 598 | | | | | |
| ΔTg (° C.) | 147 | | | | | |
| Thermal expansion coefficient (×10⁻⁷/° C.) | 129 | | | | | |
| Specific gravity | 2.60 | | 2.52 | 2.68 | 2.57 | |
| Young's modulus (GPa) | 104 | | 91 | 108 | 101 | |
| Vickers hardness | 721 | 764 | 610 | 755 | 730 | 722 |
| Fracture toughness value | | | | | | |
| Refractive index | 1.5713 | | | | | |

GC18, in which lithium disilicate crystals had precipitated besides lithium metasilicate crystals, contained crystals having large particle diameters and had a large haze value and a poor appearance. GC20 and GC21, in which β-spodumene had precipitated, had glass transition points after crystallization higher than 800° C. and had poor bending processability.

<Chemical Strengthening Treatment and Evaluation of Strengthened Glasses>

GC1 to GC16, GC19, GC22, and G1 which had not been crystallized were each subjected to a two-step chemical strengthening treatment consisting of 3-hours immersion in 450° C. sodium nitrate and subsequent 1-hour immersion in 450° C. potassium nitrate. Thus, strengthened glasses SG1 to SG19 were obtained. SG1 to SG16 are Working Examples, and SG17 to SG19 are Comparative Examples.

(Stress Profile)

Stress values were measured using surface stress meter FSM-6000, manufactured by Orihara Manufacturing Co., Ltd., and measuring device SLP-2000 utilizing scattered-light photoelasticity, manufactured by Orihara Manufacturing Co., Ltd., and thereby a compressive stress value $CS_0$ [unit: MPa] on the glass surface, a compressive stress value $CS_{50}$ [unit: MPa] at a depth of 50 μm, and a depth DOL [unit: μm] at which the compressive stress value became zero were read out. The results thereof are shown in Tables 6 and 7.

A stress profile of SG13 is shown in FIG. 1.

TABLE 6

|  | SG1 | SG2 | SG3 | SG4 | SG5 | SG6 | SG7 | SG8 | SG9 |
|---|---|---|---|---|---|---|---|---|---|
| Glass for strengthening | GC1 | GC2 | GC3 | GC4 | GC5 | GC6 | GC7 | GC8 | GC9 |
| DOL (μm) | 130 |  |  |  |  |  | 135 | 140 | 130 |
| $CS_0$ (MPa) | 625 | 720 | 750 | 490 | 515 | 629 | 800 | 900 | 700 |
| $CS_{50}$ (MPa) | 195 |  |  |  |  |  | 155 | 150 |  |

TABLE 7

|  | SG10 | SG11 | SG12 | SG13 | SG14 | SG15 | SG16 | SG17 | SG18 | SG19 |
|---|---|---|---|---|---|---|---|---|---|---|
| Glass for strengthening | GC10 | GC11 | GC12 | GC13 | GC14 | GC15 | GC16 | G1 | GC19 | GC22 |
| DOL (μm) | 124 | 140 | 122 | 126 | 125 |  | 120 |  |  | 50 |
| $CS_0$ (MPa) |  |  |  | 760 | 720 | 490 | 710 | 300 | 395 | 1000 |
| $CS_{50}$ (MPa) | 230 | 209 | 214 | 222 |  |  | 179 |  |  | 0 |

SG17, which was obtained by chemically strengthening the glass which has not been subjected to crystallization, had a small value of $CS_0$ because stress relaxation occurred during the strengthening treatment. SG18, which was obtained by chemically strengthening glass ceramic GC19 having a high $K_2O$ content, also had a small value of $CS_0$. SG19, which was obtained by chemically strengthening glass ceramic GC22, which was a Comparative Example containing no $Li_2O$, had a small value of DOL and was less apt to have sufficient strength. It can be seen that the present glass ceramic can obtain high strength through a chemical strengthening treatment.

While the present invention has been described in detail and with reference to specific embodiments thereof, it will be apparent to one skilled in the art that various changes and modifications can be made therein without departing from the spirit and scope thereof. This application is based on a Japanese patent application filed on Feb. 8, 2019 (Application No. 2019-021896), the entire contents thereof being incorporated herein by reference. All the references cited here are incorporated herein as a whole.

The invention claimed is:

1. A glass sheet, comprising:
a glass comprising lithiumphosphate crystals and having a composition comprising, in mass % on an oxide basis, 45-64% of $SiO_2$, 8-15% of $Al_2O_3$, 10-25% of $Li_2O$, 1.9-10% of $Na_2O$, 0-5% of $K_2O$, 4-5.7% of $P_2O_5$, and 6-15% of $ZrO_2$ such that $K_2O/R_2O$ is 0 to 0.10, and $ZrO_2/R_2O$ is 0.30 to 1.5, where $R_2O$ is a total content of $Li_2O$, $Na_2O$, and $K_2O$,
wherein the glass has an average thermal expansion coefficient in a range of $90 \times 10^{-7}/°C$. to $140 \times 10^{-7}/°C$. at 50° C. to 350° C. and a Young's modulus of 92 GPa or more.

2. The glass sheet according to claim 1, wherein the composition of the glass comprises, in mass % on an oxide basis, 50-64% of $SiO_2$, 8-10% of $Al_2O_3$, 10-20% of $Li_2O$, 1.9-7% of $Na_2O$, 0-3% of $K_2O$, 5.7% of $P_2O_5$, 6-11% of $ZrO_2$, and 1-5% of $Y_2O_3$.

3. The glass sheet according to claim 2, wherein a total content of BaO, SrO, MgO, CaO, and ZnO in the composition of the glass is 2% or more.

4. The glass sheet according to claim 1, wherein the composition of the glass comprises a coloring component comprising at least one oxide selected from the group consisting of $Co_3O_4$, $MnO_2$, $Fe_2O_3$, NiO, CuO, $Cr_2O_3$, $V_2O_5$, $Bi_2O_3$, $SeO_2$, $Er_2O_3$, and $Nd_2O_3$.

5. The glass sheet according to claim 4, wherein a content of the coloring component in the composition of the glass is 1% or less in total in mass % on an oxide basis.

6. A semiconductor-supporting substrate, comprising:
the glass sheet of claim 1.

7. The glass sheet according to claim 1, wherein the glass comprises lithium metasilicate crystals.

8. The glass sheet according to claim 7, wherein the glass does not comprise lithium disilicate.

9. The glass sheet according to claim 1, wherein the glass has a light transmittance in a range of 85% to 91% when the glass has a thickness of 0.7 mm.

10. The glass sheet according to claim 1, wherein the glass has a haze value in a range of 0.02% to 1.0% when the glass has a thickness of 0.7 mm.

11. The glass sheet according to claim 1, wherein the glass has a degree of crystallinity in a range of 5% to 70%.

12. The glass sheet according to claim 11, wherein the glass comprises precipitated crystals having an average particle size of 80 nm or less.

13. The glass sheet according to claim 1, wherein the glass has a Vickers hardness of 600 or more.

14. The glass sheet according to claim 1, wherein the glass has a glass transition temperature in arrange of 390° C. to 650° C.

15. The glass sheet according to claim 2, wherein the composition of the glass comprises a coloring component comprising at least one oxide selected from the group consisting of $Co_3O_4$, $MnO_2$, $Fe_2O_3$, NiO, CuO, $Cr_2O_3$, $V_2O_5$, $Bi_2O_3$, $SeO_2$, $Er_2O_3$, and $Nd_2O_3$.

16. The glass sheet according to claim 15, wherein a content of the coloring component in the composition of the glass is 1% or less in total in mass % on an oxide basis.

17. A semiconductor-supporting substrate, comprising: the glass sheet of claim 2.

18. The glass sheet according to claim 2, wherein the glass comprises lithium metasilicate crystals.

19. The glass sheet according to claim 18, wherein the glass does not comprise lithium disilicate.

20. The glass sheet according to claim 2, wherein the glass has a light transmittance in a range of 85% to 91% when the glass has a thickness of 0.7 mm.

\* \* \* \* \*